(12) United States Patent
Chen

(10) Patent No.: US 11,312,615 B2
(45) Date of Patent: Apr. 26, 2022

(54) METHOD TO FORM A ROUGH CRYSTALLINE SURFACE

(71) Applicant: Taiwan Semiconductor Manufacturing Co., Ltd., Hsin-Chu (TW)

(72) Inventor: Ting-Jung Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/942,055

(22) Filed: Jul. 29, 2020

(65) Prior Publication Data
US 2022/0033246 A1 Feb. 3, 2022

(51) Int. Cl.
*B81B 3/00* (2006.01)
*B81B 7/00* (2006.01)
*B81C 1/00* (2006.01)

(52) U.S. Cl.
CPC .......... *B81B 3/001* (2013.01); *B81B 7/0038* (2013.01); *B81C 1/00285* (2013.01); *B81C 1/00968* (2013.01); *B81B 2203/0127* (2013.01); *B81B 2203/0315* (2013.01); *B81C 2201/0132* (2013.01); *B81C 2203/0118* (2013.01)

(58) Field of Classification Search
CPC ............. B81B 3/001; B81B 7/0038; B81B 2203/0127; B81B 2203/0315; B81C 1/00285; B81C 1/00968; B81C 2201/0132; B81C 2203/0118
See application file for complete search history.

(56) References Cited

U.S. PATENT DOCUMENTS

| 10,526,199 B1 | 1/2020 | Chen et al. |
| 2003/0146464 A1 | 8/2003 | Prophet |
| 2007/0218630 A1* | 9/2007 | Yamaguchi ............. B81B 3/001 438/257 |
| 2007/0249079 A1 | 10/2007 | Sasagawa et al. |

(Continued)

FOREIGN PATENT DOCUMENTS

DE    102014213836 A1    1/2016

OTHER PUBLICATIONS

Yun et al. ("Stencil Nano Lithography Based on a Nanoscale Polymer Shadow Mask: Towards Organic Nanoelectronics," Scientific Reports, 5:10220, 2015) (Year: 2015).*

Primary Examiner — Yasser A Abdelaziez
(74) Attorney, Agent, or Firm — Eschweiler & Potashnik, LLC

(57) ABSTRACT

Various embodiments of the present disclosure are directed towards a method to roughen a crystalline layer. A crystalline layer is deposited over a substrate. A mask material is diffused into the crystalline layer along grain boundaries of the crystalline layer. The crystalline layer and the mask material may, for example, respectively be or comprise polysilicon and silicon oxide. Other suitable materials are, however, amenable. An etch is performed into the crystalline layer with an etchant having a high selectivity for the crystalline layer relative to the mask material. The mask material defines micro masks embedded in the crystalline layer along the grain boundaries. The micro masks protect underlying portions of the crystalline layer during the etch, such that the etch forms trenches in the crystalline layer where unmasked by the micro masks.

20 Claims, 17 Drawing Sheets

(56) References Cited

U.S. PATENT DOCUMENTS

2016/0238741 A1* 8/2016 Chang .................... G02B 1/118
2017/0313573 A1 11/2017 Montez et al.
2020/0176667 A1* 6/2020 Kimura ............... H01L 41/0815

* cited by examiner

METHOD TO FORM A ROUGH CRYSTALLINE SURFACE

BACKGROUND

Microelectromechanical systems (MEMS) devices have found widespread use in many modern-day electronic devices. For example, MEMS accelerometers are commonly found in automobiles (e.g., in airbag deployment systems), tablet computers, smart phones, and so on. For many applications, MEMS devices are electrically connected to application-specific integrated circuits (ASICs) to form a MEMS packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
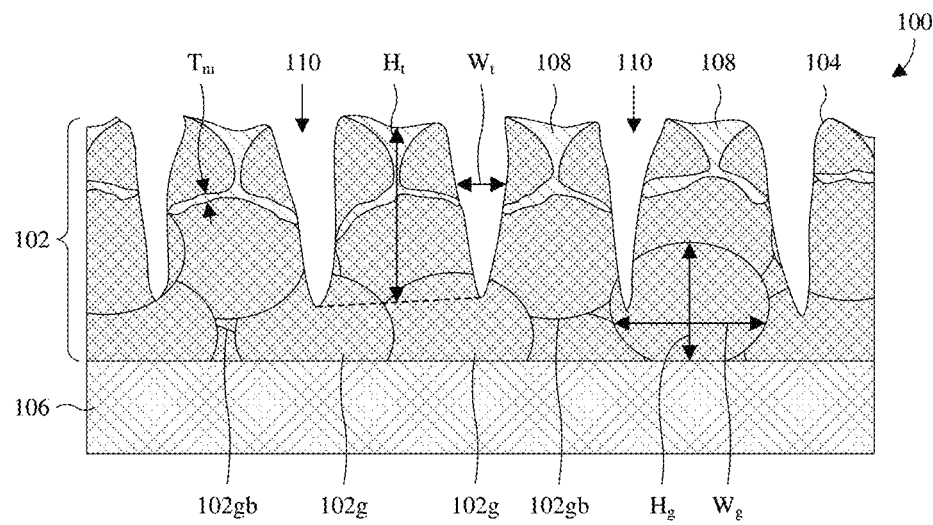
FIG. 1 illustrates a cross-sectional view of some embodiments of a rough crystalline layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microelectromechanical systems (MEMS) device may comprise a moveable structure and a neighboring sensing electrode. Examples of the MEMS device include accelerometers, gyroscopes, pressure sensors, and so on. The sensing electrode is fixed and capacitively coupled to the moveable structure. The moveable structure is moveable within a cavity relative to the sensing electrode. The moveable structure moves in response to external stimuli, such as acceleration, gravity, pressure, and so on. Distance variation between the moveable structure and the sensing electrode is detected through the capacitive coupling and transmitted to a measurement circuit for further processing.

A challenge with the MEMS device is stiction. Stiction refers to the tendency of the moveable structure to come into contact with a neighboring surface and "stick" to the neighboring surface. Stiction may, for example, occur during normal operation when the moveable structure moves to such an extreme that it comes in contact with or comes in close proximity to the neighboring surface. Stiction may arise due to van der Waals force and other suitable forces between surfaces. As feature sizes shrink for successive generations of technology, stiction is becoming increasingly important. Stiction reduces the sensitivity of MEMS devices and reduces the lifetime of MEMS devices.

The present disclosure is directed towards a method to form a rough crystalline layer, which may, for example, be employed to reduce stiction in MEMS devices. According to some embodiments of the method, a crystalline layer is deposited over a substrate. A mask material is diffused into the crystalline layer along grain boundaries of the crystalline layer. The mask material may, for example, be diffused into the crystalline layer by thermal oxidation and/or some other suitable process. The crystalline layer may, for example, be or comprise polycrystalline silicon and/or some other suitable crystalline material, and/or the mask material may, for example, be or comprise oxide and/or some other suitable material. An etch with a high selectivity for the crystalline layer relative to the mask material is performed into the crystalline layer. Mask material that diffused into the crystalline layer along the grain boundaries defines micro masks that protect underlying portions of the crystalline layer during the etch, such that trenches form in the crystalline layer where unmasked.

Grains of the crystalline layer have a high degree of variability, such that grain boundaries of the crystalline layer have a high degree of variability. This leads to high degree of variability in the micro masks, which leads to a high degree of variability in the trenches. The high degrees of variability in the micro masks and the trenches, in turn, lead to a high degree of roughness along a surface of the crystalline layer.

Because a surface of the crystalline layer may have a high degree of roughness, the crystalline layer may be employed to prevent stiction between a moveable structure of a MEMS device and a neighboring surface. For example, the crystalline layer may be on the moveable structure with the rough surface facing the neighboring surface. If the moveable structure gets too close to the neighboring surface so the rough and neighboring surfaces come into contact, the contact area is low because of the roughness. Because of the low contact area, van der Waals force and other suitable forces that lead to stiction are low. As such, the likelihood of stiction is low. This may increase the sensitivity and/or lifetime of the MEMS device.

With reference to FIG. 1, a cross-sectional view 100 of some embodiments of a crystalline layer 102 at least partially defining a rough surface 104 is provided. As seen hereafter (see, e.g., FIG. 3), the rough surface 104 may, for example, find application for, among other things, reducing stiction in MEMS devices. The crystalline layer 102 overlies a substrate 106, and the rough surface 104 is on an opposite side of the crystalline layer 102 as the substrate 106. The substrate 106 may, for example, be a bulk substrate of monocrystalline silicon or some other suitable type of substrate.

The crystalline layer 102 comprises a plurality of grains 102g that define grain boundaries 102gb. The crystalline layer 102 may, for example, be or comprise polycrystalline silicon (e.g., polysilicon) and/or some other suitable type of crystalline material. In some embodiments, the crystalline layer 102 is polycrystalline, such that the grains 102g have varying sizes, shapes, orientations, or any combination of the foregoing throughout the crystalline layer 102. In some embodiments, such variation is random.

Micro masks 108 extend into the crystalline layer 102, along the grain boundaries 102gb, from the rough surface 104. The micro masks 108 are a different material than the crystalline layer 102 and may, for example, be or comprise silicon oxide, silicon nitride, some other suitable material(s), or any combination of the foregoing. In some embodiments, the micro masks 108 are an oxide of the crystalline layer 102. For example, where the crystalline layer 102 is or comprise polysilicon, the micro masks 108 may be silicon oxide. The micro masks 108 extend or branch out along the grain boundaries 102gb. In some embodiments, these extensions or branches have a thickness $T_m$ that is about 10-200 angstroms, about 10-100 angstroms, about 100-200 angstroms, or some other suitable value. Further, the micro masks 108 have cross-sectional profiles that vary across the rough surface 104. For example, a micro mask may have a cross-sectional profile different than that of a neighboring micro mask.

As seen hereafter, the rough surface 104 may, for example, be formed by: 1) diffusing a mask material into the crystalline layer 102 along the grain boundaries 102gb to form the micro masks 108; and 2) performing an etch having a high selectivity for the crystalline layer 102 relative to the micro masks 108 into the crystalline layer 102. The micro masks 108 protect underlying portions of the crystalline layer 102, and the etch forms trenches 110 at portions of the crystalline layer 102 that are unprotected. Further, the etch exposes portions of the micro masks 108 that were previously buried in the crystalline layer 102.

The grains 102g have a high degree of variability, such that the grain boundaries 102gb have a high degree of variability. This leads to a high degree of variability in the micro masks 108. Because the etch exposes portions of the micro masks 108, and because the micro masks 108 have a high degree of variability, the rough surface 104 takes on this high degree of variability at the micro masks 108. Because the micro masks 108 have a high degree of variability and serve as a mask while forming the trenches 110, the trenches 110 also have a high degree of variability and the rough surface 104 takes on this high degree of variability at the trenches 110. The high degrees of variability at the trenches 110 and at the micro masks 108, in turn, lead to a high degree of roughness along the rough surface 104.

In some embodiments, the rough surface 104 has a sword-like surface profile, but other suitable surface profiles are amenable. Further, in some embodiments, the rough surface 104 has an arithmetic average roughness Ra that is high. A high arithmetic average roughness may, for example, be greater than about 5 nanometers, about 10 nanometers, about 50 nanometers, or some other suitable value. Further, a high arithmetic average roughness may, for example, be about 5-10 nanometers, about 10-50 nanometers, or some other suitable value. The arithmetic average roughness Ra may, for example, be the arithmetic average of the absolute values of the profile height deviations from the mean line. Roughness of the rough surface 104 may, for example, be measured using atomic force microscopy (AFM) or some other suitable process. Because of the arithmetic average roughness Ra is high, the rough surface 104 may be employed to reduce stiction in MEMS devices as hereafter described. If the arithmetic average roughness Ra was low (e.g., less than about 5 nanometers or some other suitable value), the rough surface 104 may minimally improve stiction in MEMS devices.

The grains 102g have individual widths $W_g$, individual heights $H_g$, and individual depths (not shown). Note that the individual depths extend into and out of the page and are hence not visible within the cross-sectional view 100 of FIG. 1. The individual widths $W_g$, the individual heights $H_g$, the individual depths, or any combination of the foregoing may, for example, be about 5-100 nanometers, about 5-50 nanometers, about 50-100 nanometers, about 50-200 nanometers, or some other suitable value.

The trenches 110 have individual widths $W_t$ and individual heights $H_t$. The individual widths $W_t$ may, for example, be about 50-200 nanometers, about 50-125 nanometers, about 125-200 nanometers, or some other suitable value. The individual heights $H_t$ may, for example, be about 204 nanometers, about 150-250 nanometers, about 150-200 nanometers, about 200-250 nanometers, about 26-300 nanometers, or some other suitable value. In some embodiments, the trenches 110 have individual ratios of the width to height (e.g., $W_t/H_t$) that are about 1.2-0.14, about 0.14-0.67, about 0.67-1.2, or some other suitable value. In at least some of such embodiments, widths of the ratios are measured at tops of the trenches 110. In some embodiments, these ratios lead to the rough surface 104 having the above-mentioned sword-like surface profile and/or other suitable surface profiles.

In some embodiments, the individual heights $H_t$ of the trenches 110 vary across the rough surface 104. For example, a trench may have a height greater than that of a neighboring trench. In some embodiments, the trenches 110 have varying widths across the rough surface 104. For example, a trench may have a width greater than a width of a neighboring trench. The widths may, for example, be at tops of the trenches 110, height-wise centers of the trenches 110, or other suitable locations. In some embodiments, the trenches 110 have varying cross-sectional profiles across the rough surface 104. For example, a trench may have a cross-sectional profile that differs from that of a neighboring trench.

Figure 2A:
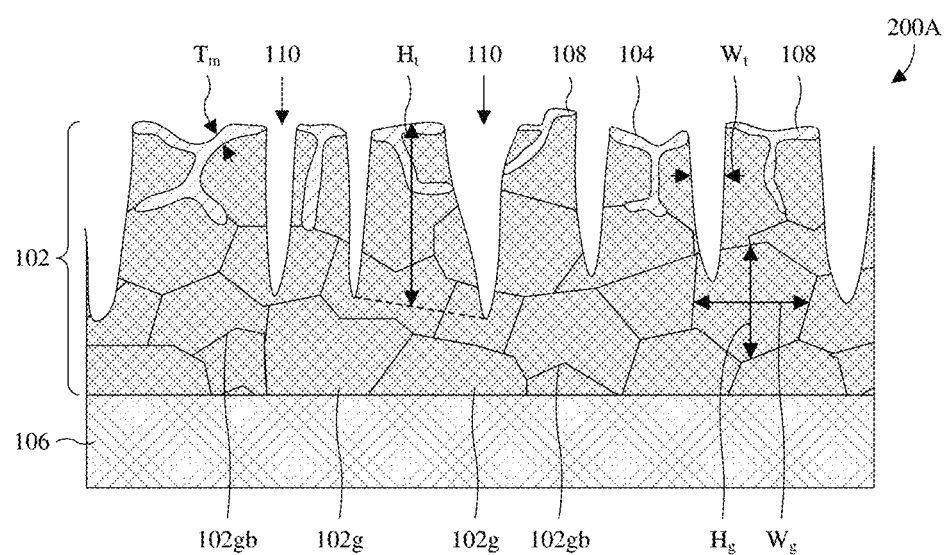
FIGS. 2A and 2B illustrate cross-sectional views of some alternative embodiments of the rough crystalline layer of FIG. 1.
Figure 2B:
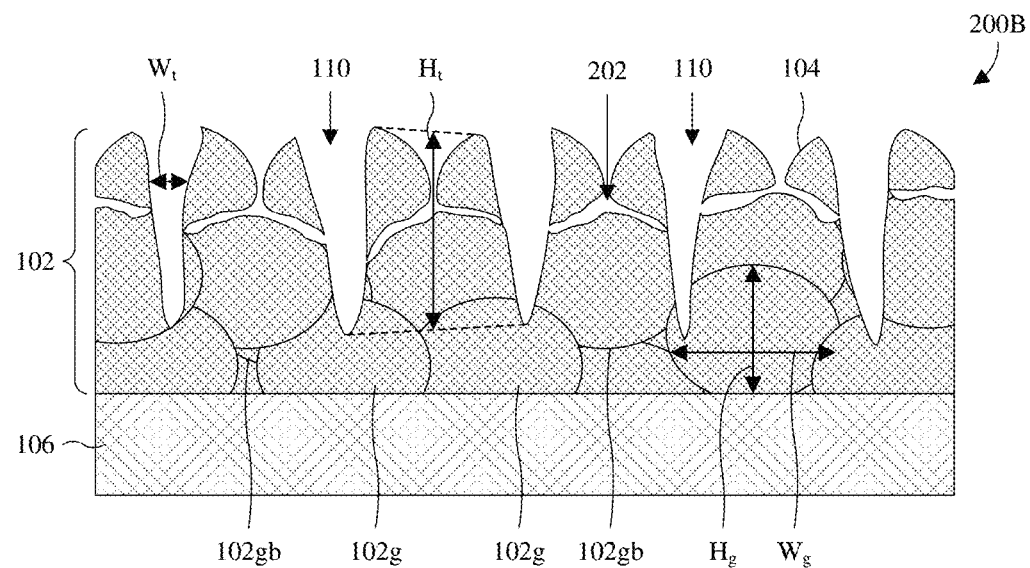

With reference to FIGS. 2A and 2B, cross-sectional views 200A, 200B of some alternative embodiments of the crystalline layer 102 of FIG. 1 is provided is provided. As illustrated by the cross-sectional view 200A of FIG. 2A, the grains 102g are more rectilinear and sizes, shapes, and orientations of the grains 102g vary. In some embodiments, such variation is random. As illustrated by the cross-sectional view 200B of FIG. 2B, the micro masks 108 have been removed and micro cavities 202 remain in place of the micro masks 108. This may further increase the roughness of the rough surface 104. Additionally, the micro cavities 202 are in direct fluid communication with an atmosphere surrounding the crystalline layer 102.

Figure 3:
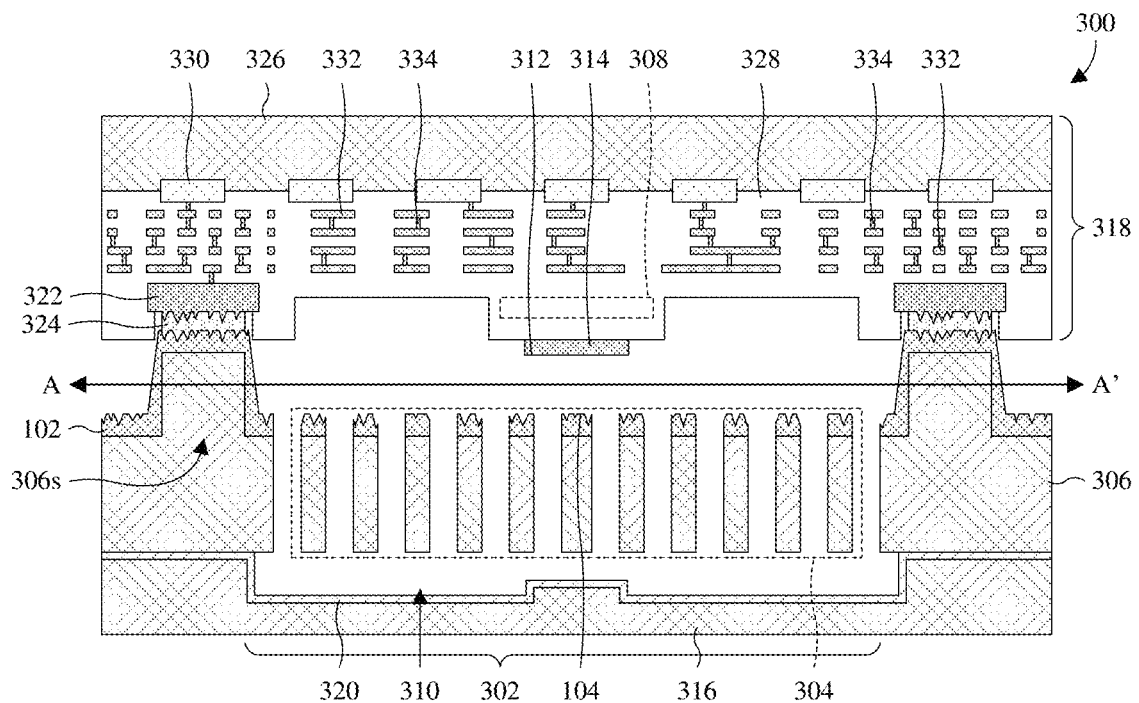
FIG. 3 illustrates a cross-sectional view of some embodiments of a microelectromechanical systems (MEMS) package comprising a MEMS motion sensor and a rough crystalline layer.

With reference to FIG. 3, a cross-sectional view 300 of some embodiments of a MEMS package comprising a MEMS motion sensor 302 and a crystalline layer 102 at least partially defining a rough surface 104 is provided. The MEMS motion sensor 302 may, for example, be a gyroscope or some other suitable type of MEMS motion sensor.

The MEMS motion sensor 302 comprises a moveable structure 304 defined by a MEMS substrate 306. The moveable structure 304 underlies and is capacitively coupled with a sensing electrode 308. Note that the sensing electrode 308 is schematically shown in phantom and may, for example, have a different form and/or location (e.g., a location outside the cross-sectional view 300 of FIG. 3). Further, the moveable structure 304 is moveable within a cavity 310, relative to the sensing electrode 308, and moves in response to external stimuli. The external stimuli may, for example, be gravity or some other suitable external stimuli. Distance variation between the moveable structure 304 and the sensing electrode 308 is detected through the capacitive coupling and processed by a measurement circuit.

In alternative embodiments, movement of the moveable structure 304 is measured without capacitive coupling and hence without the sensing electrode 308. For example, a piezoelectric layer (not shown) may wholly or partially define the moveable structure 304 and may deform in response to movement of the moveable structure 304 from the external stimuli. This deformation may cause the piezoelectric layer to produce an electric current that may be sensed to measure the movement of the moveable structure 304.

The crystalline layer 102 is on the moveable structure 304 and, as noted above, at least partially defines the rough surface 104. The rough surface 104 faces a neighboring surface 312 in the cavity 310, which is defined by a bump structure 314 and corresponds to a top surface of the cavity 310. The bump structure 314 may, for example, absorb gases within the cavity 310 to control a pressure within the cavity 310 and/or may, for example, provide some other suitable function. The crystalline layer 102 and the rough surface 104 may, for example, be as illustrated and described at any one of FIGS. 1, 2A, and 2B. When the crystalline layer 102 and the rough surface 104 are as illustrated and described at FIG. 2B, the micro cavities 202 (see, e.g., FIG. 2B) are in direct fluid communication with an atmosphere of the cavity 310.

Because the crystalline layer 102 is on the moveable structure 304 with the rough surface 104 facing the neighboring surface 312 in the cavity 310, the likelihood of stiction between the moveable structure 304 and the neighboring surface 312 is low. For example, if the moveable structure 304 gets too close to the neighboring surface 312 and the rough and neighboring surfaces 104, 312 come into contact, the contact area is low because of the roughness. Because of the low contact area, van der Waals force and other suitable forces that lead to stiction are low. As such, the likelihood of stiction is low. This may increase the sensitivity and/or lifetime of the MEMS motion sensor 302.

The cavity 310 is defined between a cap substrate 316 and an integrated circuit (IC) 318. The cap substrate 316 underlies the MEMS substrate 306 and is fusion bonded to the MEMS substrate 306 through an inter-substrate dielectric layer 320. The inter-substrate dielectric layer 320 may, for example, be or comprise silicon oxide and/or some other suitable dielectric(s). The MEMS substrate 306 may, for example, be a bulk substrate of monocrystalline silicon or some other suitable type of substrate, and/or the cap substrate 316 may, for example, be a bulk substrate of monocrystalline silicon or some other suitable type of substrate.

The IC 318 overlies the MEMS substrate 306 and may, for example, be an application-specific IC (ASIC), a complementary metal-oxide-semiconductor (CMOS) IC, some other suitable type of IC, or any combination of the foregoing. Further, the IC 318 is eutectically bonded to the MEMS substrate 306 at a standoff 306s of the MEMS substrate 306. An IC-side eutectic bond structure 322 is on the IC 318. A MEMS-side eutectic bond structure 324 is on the standoff 306s and is eutectically bonds with the IC-side eutectic bond structure 322. The IC-side eutectic bond structure 322 may, for example, be or comprise aluminum copper and/or some other suitable metal, and the MEMS-side eutectic bond structure 324 may, for example, be or comprise germanium and/or some other suitable metal.

The IC 318 comprises a device substrate 326, an interconnect dielectric layer 328, and a plurality of semiconductor devices 330. The interconnect dielectric layer 328 underlies the device substrate 326 between the device and MEMS substrates 326, 306, and the semiconductor devices 330 are in the device substrate 326 between the interconnect dielectric layer 328 and the device substrate 326. The device substrate 326 may, for example, be a bulk substrate of monocrystalline silicon or some other suitable type of substrate. The interconnect dielectric layer 328 may, for example, be or comprise silicon oxide and/or some other suitable dielectric(s). The semiconductor devices 330 may, for example, be metal-oxide-semiconductor field-effect transistors (MOSFETs) and/or some other suitable type of semiconductor devices.

The interconnect dielectric layer 328 accommodates a plurality of wires 332 and a plurality of vias 334. The wires 332 and the vias 334 are alternatingly stacked to define conductive paths leading from the semiconductor devices 330 and may, for example, define an electrical interconnect structure. In some embodiments, the wires 332 and the vias 334 define a conductive path leading to the sensing electrode 308 and/or define a conductive path leading to the IC-side eutectic bond structure 322. The wires 332 and the vias 334 may, for example, be or comprise metal and/or some other suitable conductive material(s).

Figure 4:
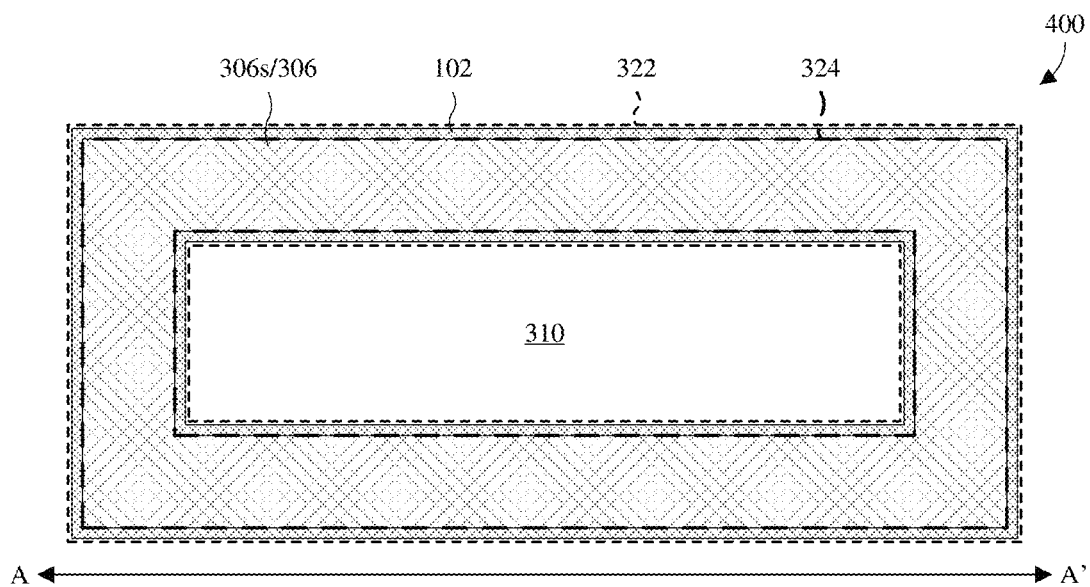
FIG. 4 illustrates a top view of some embodiments of the MEMS package of FIG. 3 along line A-A' in FIG. 3.

With reference to FIG. 4, a top view 400 of some embodiments of the MEMS package of FIG. 3 along line A-A' in FIG. 3 is provided. The standoff 306s of the MEMS substrate 306 extends in a closed path around the cavity 310. Similarly, the IC-side eutectic bond structure 322 (shown in phantom) and the MEMS-side eutectic bond structure 324 (shown in phantom) extend in closed paths around the cavity 310. The standoff 306s, the IC-side eutectic bond structure 322, and the MEMS-side eutectic bond structure 324 have a square ring-shaped layout, but other suitable layouts that extend in closed paths are amenable.

Figure 5A:
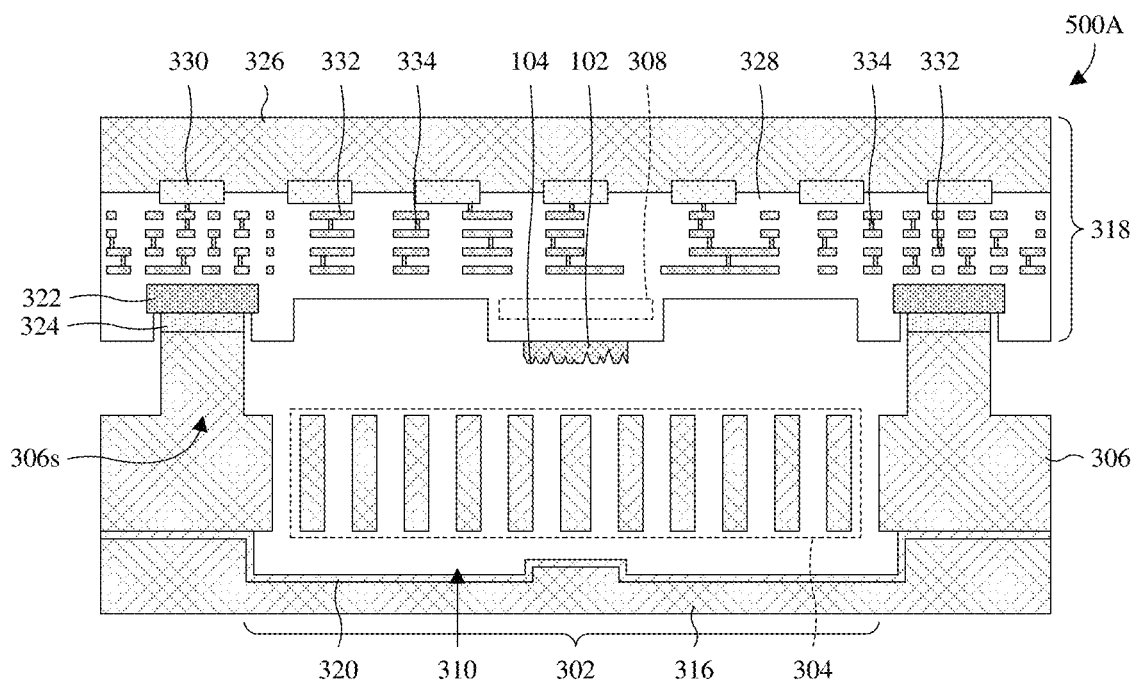
FIGS. 5A-5C illustrate cross-sectional views of some alternative embodiments of the MEMS package of FIG. 3 in which a location of the rough crystalline layer is varied.
Figure 5B:
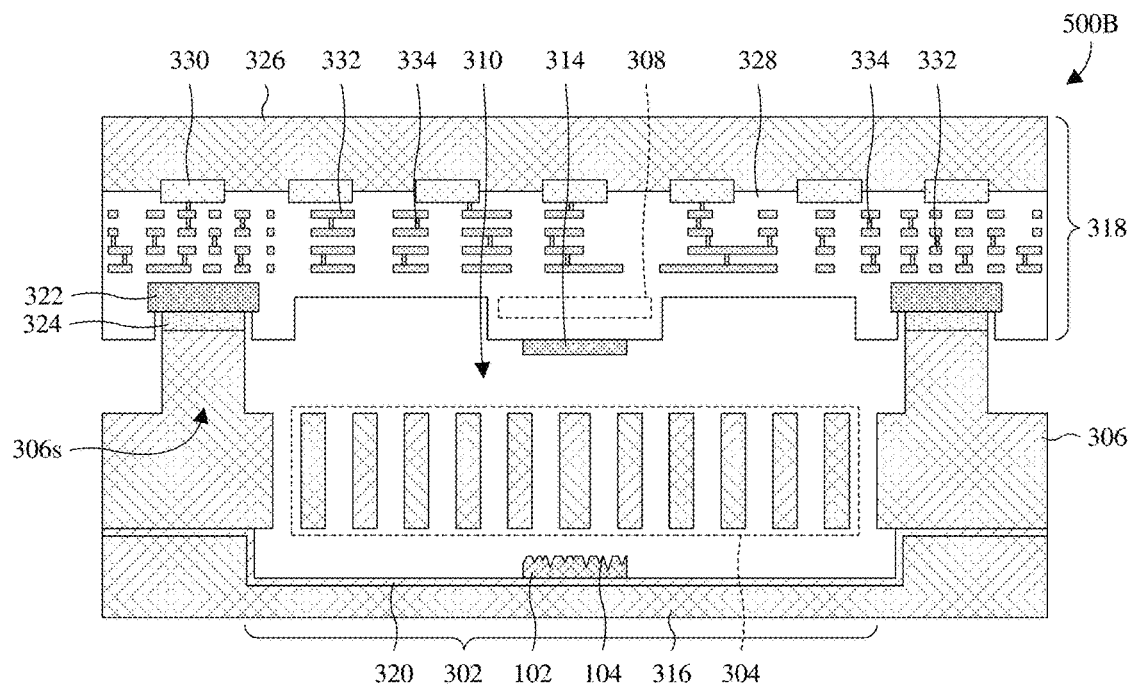
Figure 5C:
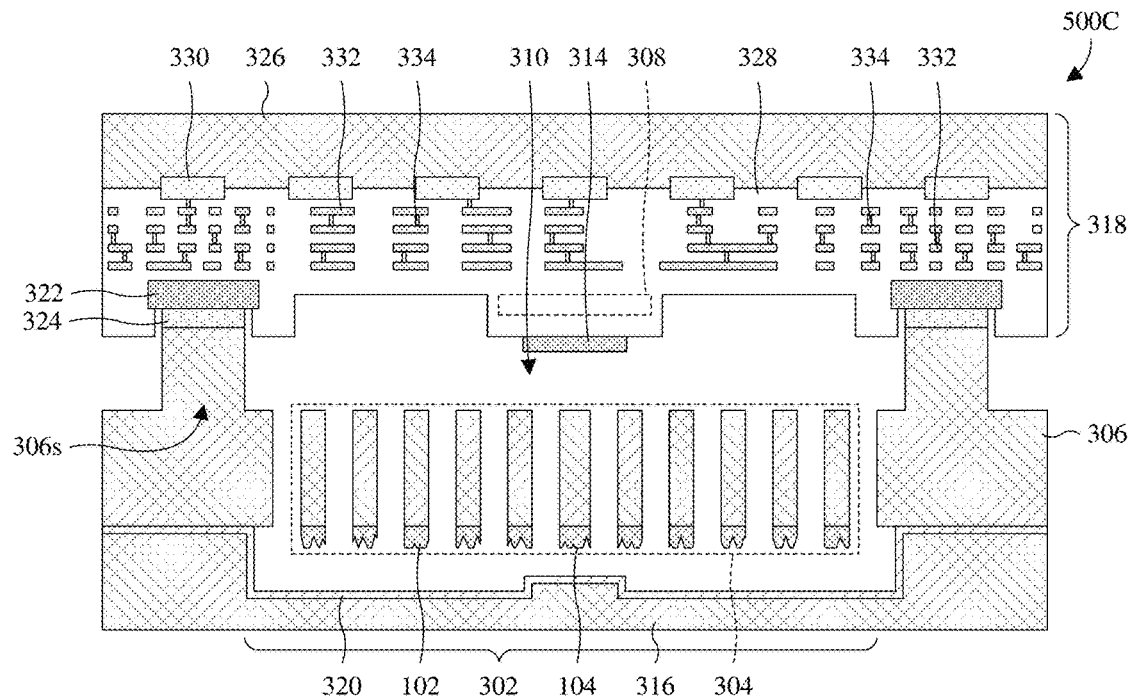

With reference to FIGS. 5A-5C, cross-sectional views 500A-500C of some alternative embodiments of the MEMS package of FIG. 3 are provided in which the location of the crystalline layer 102 is varied.

As illustrated by the cross-sectional view 500A of FIG. 5A, the crystalline layer 102 is localized to a center of the cavity 310 and is in place of the bump structure 314 (see, e.g., FIG. 3). Further, the rough surface 104 faces the moveable structure 304 and is fixed relative to the moveable structure 304.

As illustrated by the cross-sectional view 500B of FIG. 5B, the crystalline layer 102 is localized to a center of the cavity 310 and underlies the moveable structure 304 on the inter-substrate dielectric layer 320. Further, the rough surface 104 faces the moveable structure 304 and is fixed relative to the moveable structure 304.

As illustrated by the cross-sectional view 500C of FIG. 5C, the crystalline layer 102 is on an underside of the moveable structure 304. Further, the rough surface 104 faces the inter-substrate dielectric layer 320 and is moveable with the moveable structure 304.

Figure 6:
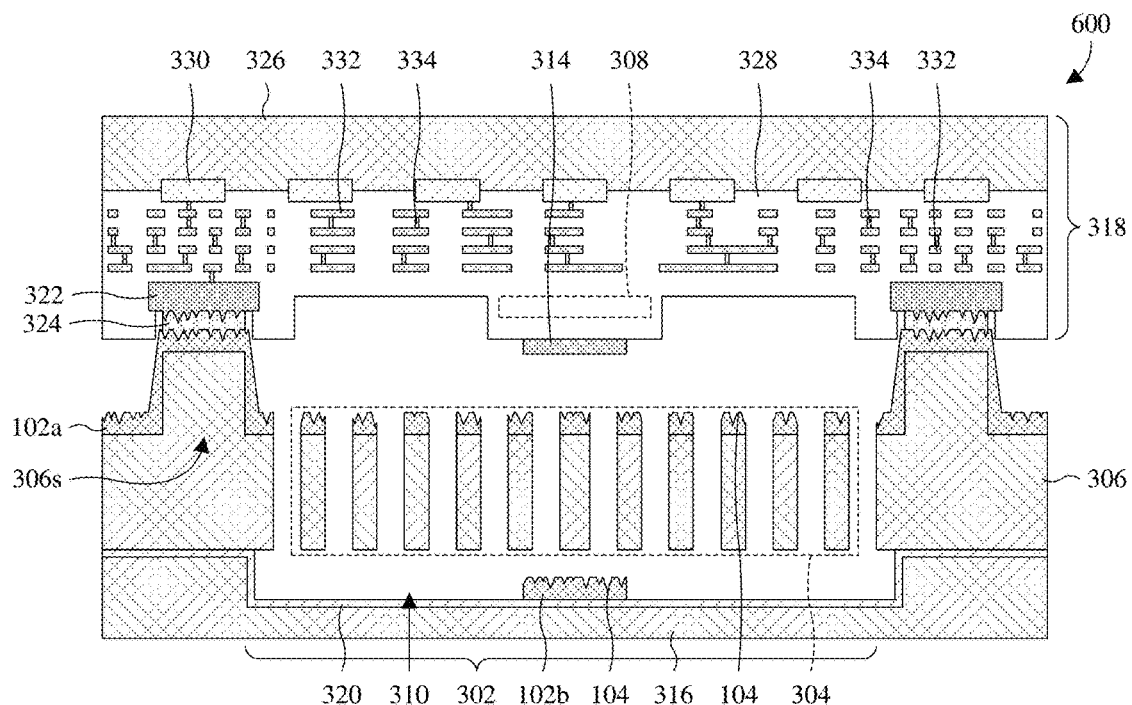
FIG. 6 illustrates a cross-sectional view of some alternative embodiments of the MEMS package of FIG. 3 in which the MEMS package comprises multiple rough crystalline layers.

With reference to FIG. 6, a cross-sectional view 600 of some alternative embodiments of the MEMS package of FIG. 3 is provided in which the MEMS package comprises multiple crystalline layers at least partially defining rough surfaces 104.

A first crystalline layer 102a overlies the MEMS substrate 306 on an upper side of the MEMS substrate 306. Further, a rough surface 104 of the first crystalline layer 102a faces the bump structure 314 and is moveable with the moveable structure 304. A second crystalline layer 102b is localized to a center of the cavity 310 and underlies the moveable structure 304 on the inter-substrate dielectric layer 320. Further, a rough surface 104 of the second crystalline layer 102b faces the moveable structure 304 and is fixed relative to the moveable structure 304.

The first and second crystalline layers 102a, 102b respectively reduce stiction at a top and a bottom of the cavity 310. Further, the first and second crystalline layers 102a, 102b are respectively as the crystalline layer 102 is illustrated and described at any one or combination of FIGS. 1, 2A, and 2B. In some embodiments, the first and second crystalline layers 102a, 102b correspond to different embodiments of the crystalline layer 102 in FIGS. 1, 2A, and 2B. For example, the first crystalline layer 102a may be as the crystalline layer 102 of FIG. 1, whereas the second crystalline layer 102b may be as the crystalline layer 102 of FIG. 2B, or vice versa.

Figure 7A:
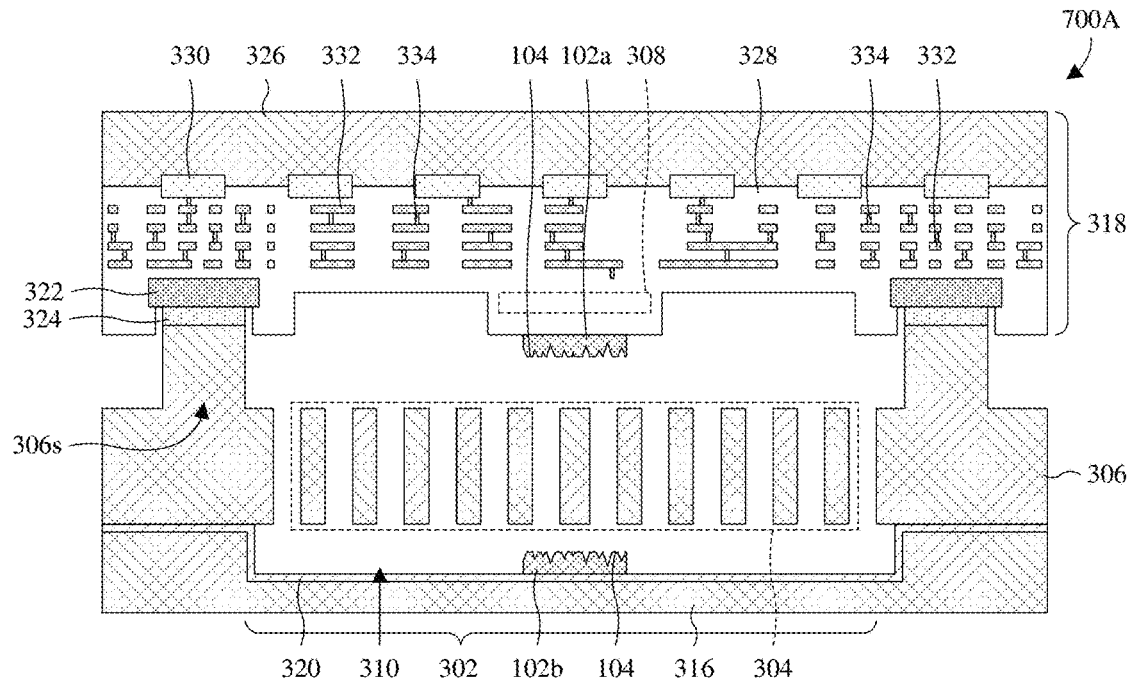
FIGS. 7A-7C illustrate cross-sectional views of some alternative embodiments of the MEMS package of FIG. 6 in which locations of the rough crystalline layers are varied.
Figure 7B:
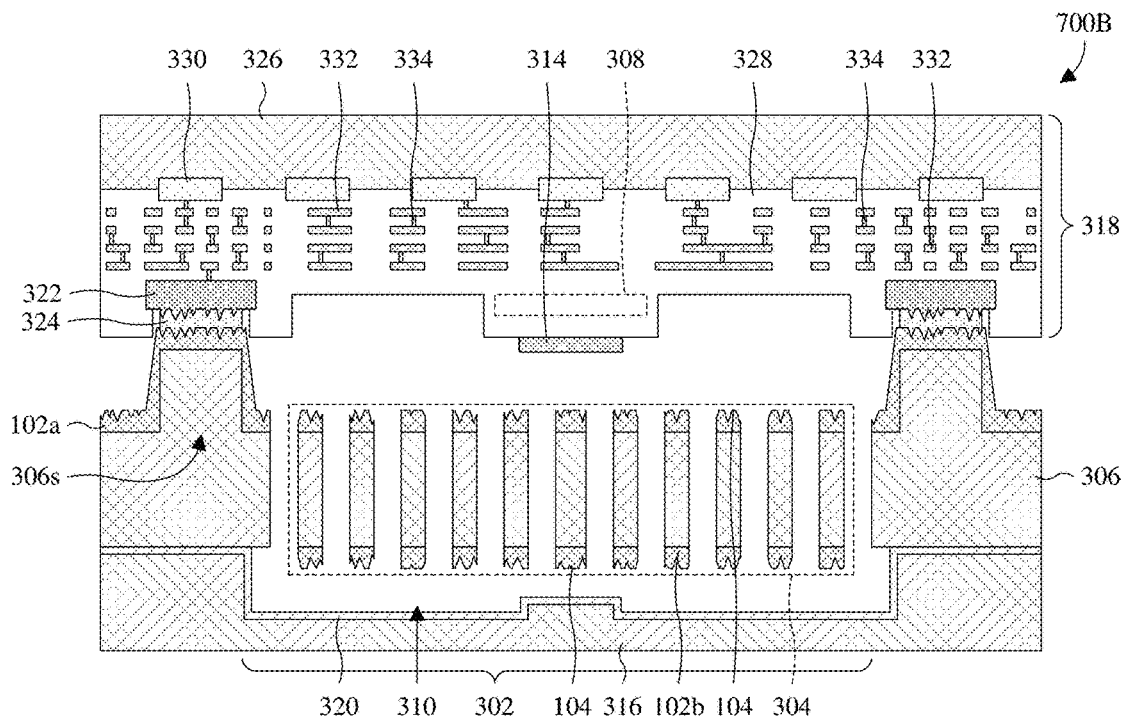
Figure 7C:
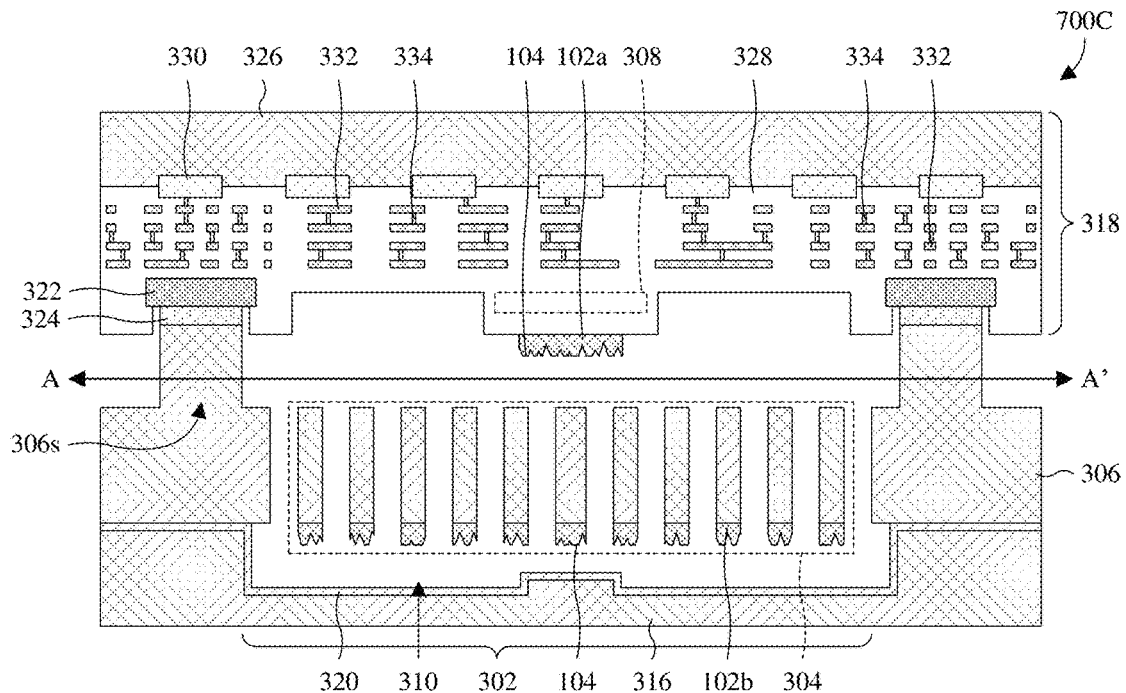

With reference to FIGS. 7A-7C, cross-sectional views 700A-700C of some alternative embodiments of the MEMS package of FIG. 6 are provided in which locations of the first and second crystalline layers 102a, 102b are varied.

As illustrated by the cross-sectional view 700A of FIG. 7A, the first crystalline layer 102a is localized to a center of the cavity 310 and is in place of the bump structure 314 (see, e.g., FIG. 6). Further, the rough surface 104 of the first crystalline layer 102a faces the moveable structure 304 and is fixed relative to the moveable structure 304.

As illustrated by the cross-sectional view 700B of FIG. 7B, the second crystalline layer 102b is on an underside of the moveable structure 304. Further, the rough surface 104 of the second crystalline layer 102b faces the inter-substrate dielectric layer 320 and is moveable with the moveable structure 304.

As illustrated by the cross-sectional view 700C of FIG. 7C, the first crystalline layer 102a is localized to a center of the cavity 310 and is in place of the bump structure 314 (see, e.g., FIG. 6) as in FIG. 7A. Further, the second crystalline layer 102b is on an underside of the moveable structure 304 as in FIG. 7B.

Figure 8:
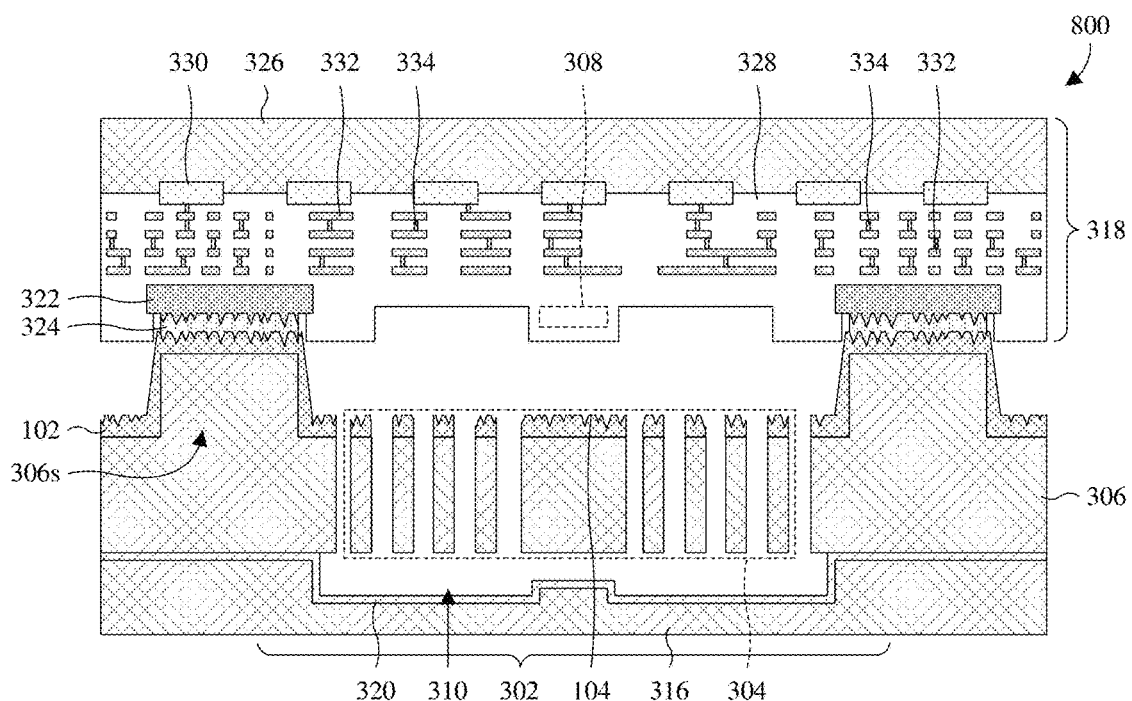
FIG. 8 illustrates a cross-sectional view of some alternative embodiments of the MEMS package of FIG. 3 in which a layout of a MEMS motion sensor is varied.

With reference to FIG. 8, a cross-sectional view 800 of some alternative embodiments of the MEMS package of FIG. 3 is provided in which a layout of the MEMS motion sensor 302 is varied. For example, the moveable structure 304 of the MEMS motion sensor 302 may have a larger mass at a center of the cavity 310. Other suitable layouts are, however, amenable. Additionally, the bump structure 314 (see, e.g., FIG. 3) is omitted.

Figure 9:
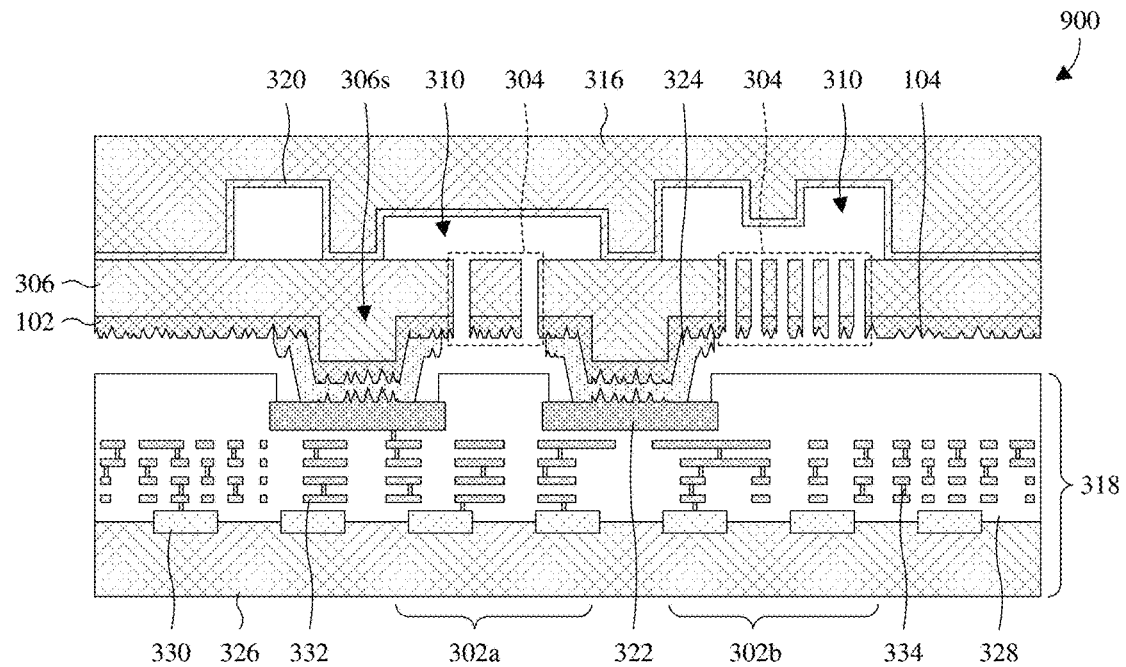
FIG. 9 illustrates a cross-sectional view of some embodiments of a MEMS package comprising multiple MEMS motion sensors and a rough crystalline layer.

With reference to FIG. 9, a cross-sectional view 900 of some embodiments of a MEMS package comprising a first MEMS motion sensor 302a, a second MEMS motion sensor 302b, and a crystalline layer 102 at least partially defining a rough surface 104 is provided. The first MEMS motion sensor 302a may, for example, be an accelerometer or some other suitable type of motion sensor, and/or the second MEMS motion sensor 302b may, for example, be a gyroscope or some other suitable type of motion sensor.

The first and second MEMS motion sensors 302a, 302b comprise corresponding moveable structures 304 defined by a MEMS substrate 306. The moveable structures 304 are moveable within corresponding cavities 310 and move in response to external stimuli. The external stimuli may, for example, be gravity, acceleration, or some other suitable external stimuli. Movement of the moveable structures 304 may, for example, be measured by capacitance coupling, piezoelectric deformation, or some other suitable phenomenon.

The crystalline layer 102 is on an underside of the MEMS substrate 306 and lines the moveable structures 304. Further, as noted above, the crystalline layer 102 at least partially defines a rough surface 104 to prevent stiction with neighboring surfaces. The roughness reduces the contact area between the rough surface 104 and the neighboring surfaces if the rough surface 104 were to come into contact with the neighboring surfaces. This reduces van der Waals force and other suitable forces that lead to stiction and hence reduces the likelihood of stiction. The crystalline layer 102 and the rough surface 104 may, for example, be as illustrated and described at any one of FIGS. 1, 2A, 2B.

The cavities 310 are defined between a cap substrate 316 and an IC 318. The cap substrate 316 overlies the MEMS substrate 306 and is fusion bonded to the MEMS substrate 306 through an inter-substrate dielectric layer 320. The IC 318 underlies the MEMS substrate 306 and is eutectically bonded to the MEMS substrate 306 at a standoff 306s of the MEMS substrate 306. An IC-side eutectic bond structure 322 is on the IC 318. A MEMS-side eutectic bond structure 324 is on the standoff 306s and is eutectically bonds with the IC-side eutectic bond structure 322. The IC 318 may, for example, be described at FIG. 3.

Figure 10:
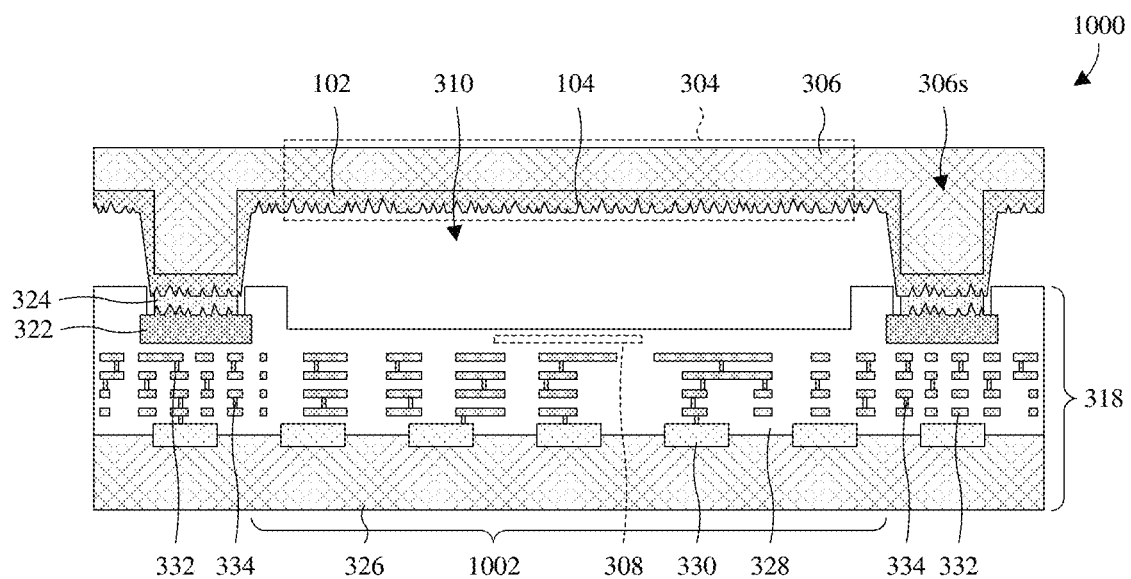
FIG. 10 illustrates a cross-sectional view of some embodiments of a MEMS package comprising a MEMS pressure sensor and a rough crystalline layer.

With reference to FIG. 10, a cross-sectional view 1000 of some embodiments of a MEMS package comprising a MEMS pressure sensor 1002 and a crystalline layer 102 at least partially defining a rough surface 104 is provided. The MEMS pressure sensor 1002 comprises a moveable structure 304 defined by a MEMS substrate 306.

The moveable structure 304 is a flexible membrane that overlies and is capacitively coupled with a sensing electrode 308 (schematically shown in phantom). Further, the moveable structure 304 is moveable within a cavity 310, relative to the sensing electrode 308, and moves in response to changes with an ambient pressure. For example, the cavity 310 may be hermetically sealed with a cavity pressure and the moveable structure 304 may deform as the ambient pressure changes relative to the cavity pressure. Distance variation between the moveable structure 304 and the sensing electrode 308 is then detected through the capacitive coupling and processed by a measurement circuit. In alternative embodiments, movement of the moveable structure 304 is measured without capacitive coupling and hence without the sensing electrode 308. For example, the movement may be measured using piezoelectric material.

The crystalline layer 102 is on an underside of the moveable structure 304 and at least partially defines the rough surface 104 to prevent stiction with neighboring surfaces that the rough surface 104 faces. The crystalline layer 102 and the rough surface 104 may, for example, be as illustrated and described at any one of FIGS. 1, 2A, 2B.

The cavity 310 is defined between the MEMS substrate 306 and an IC 318. The IC 318 underlies the MEMS substrate 306 and is eutectically bonded to the MEMS substrate 306 at a standoff 306s of the MEMS substrate 306. An IC-side eutectic bond structure 322 is on the IC 318. A MEMS-side eutectic bond structure 324 is on the standoff 306s. The IC 318 may, for example, be described at FIG. 3.

Figure 11:
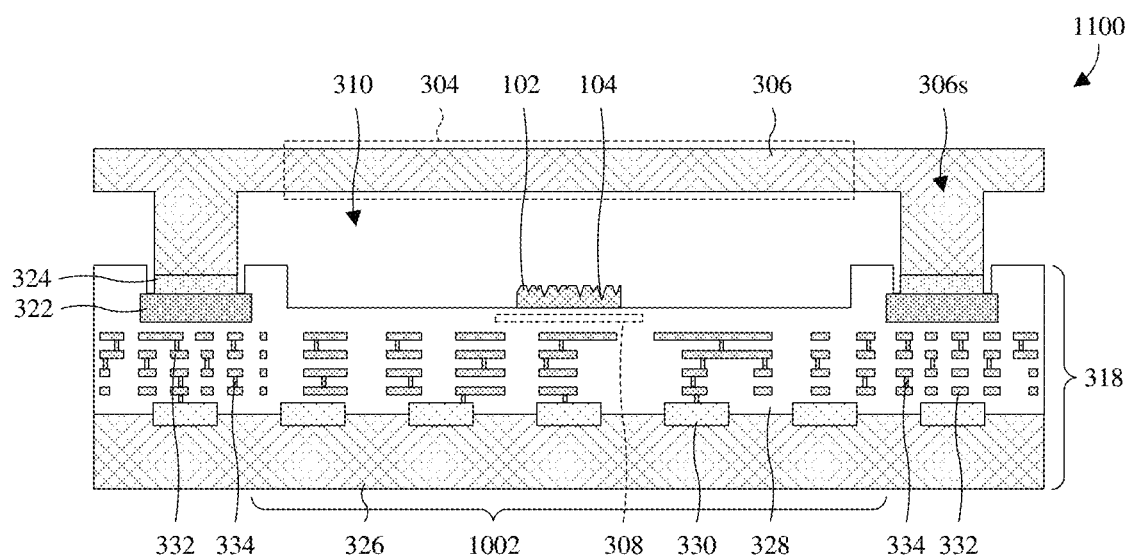
FIG. 11 illustrates a cross-sectional view of some alternative embodiments of the MEMS package of FIG. 10 in which a location of the rough crystalline layer is varied.

With reference to FIG. 11, a cross-sectional view 1100 of some alternative embodiments of the MEMS package of FIG. 10 is provided in which a location of the crystalline layer 102 is varied. The crystalline layer 102 is on the IC 318. Further, the rough surface 104 faces the moveable structure 304 and is fixed relative to the moveable structure 304.

Figure 12:
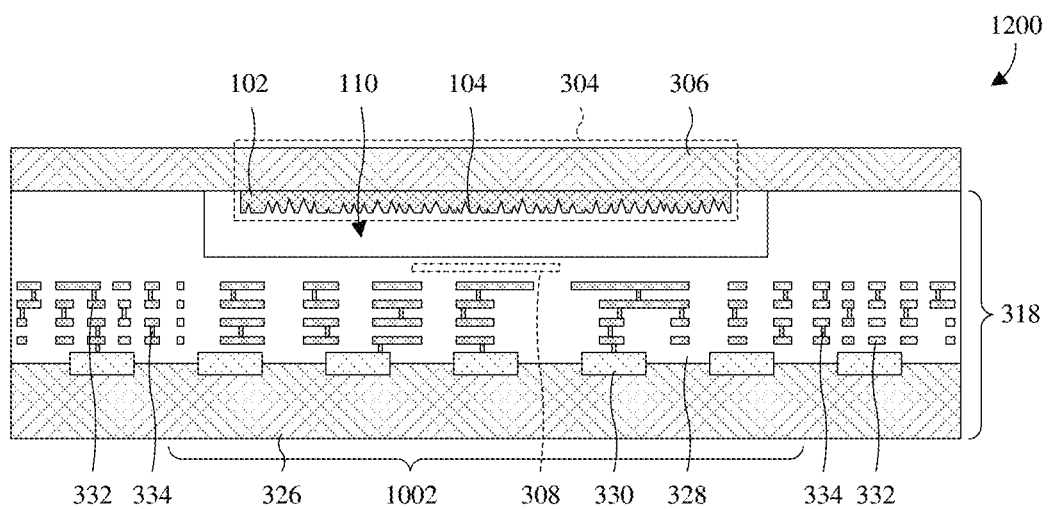
FIG. 12 illustrates a cross-sectional view of some alternative embodiments of the MEMS package of FIG. 10 in which a MEMS substrate and an integrated circuit (IC) are fusion bonded together.

With reference to FIG. 12, a cross-sectional view 1200 of some alternative embodiments of the MEMS package of FIG. 10 is provided in which the MEMS substrate 306 and the IC 318 are fusion bonded together. Hence, the standoff 306s of the MEMS substrate 306, the IC-side eutectic bond structure 322, and the MEMS-side eutectic bond structure 324 are omitted. Further, the crystalline layer 102 is localized to the cavity 310. While the crystalline layer 102 is on the moveable structure 304, the crystalline layer 102 may alternatively be on the IC 318 as illustrated in FIG. 11.

Figure 13:
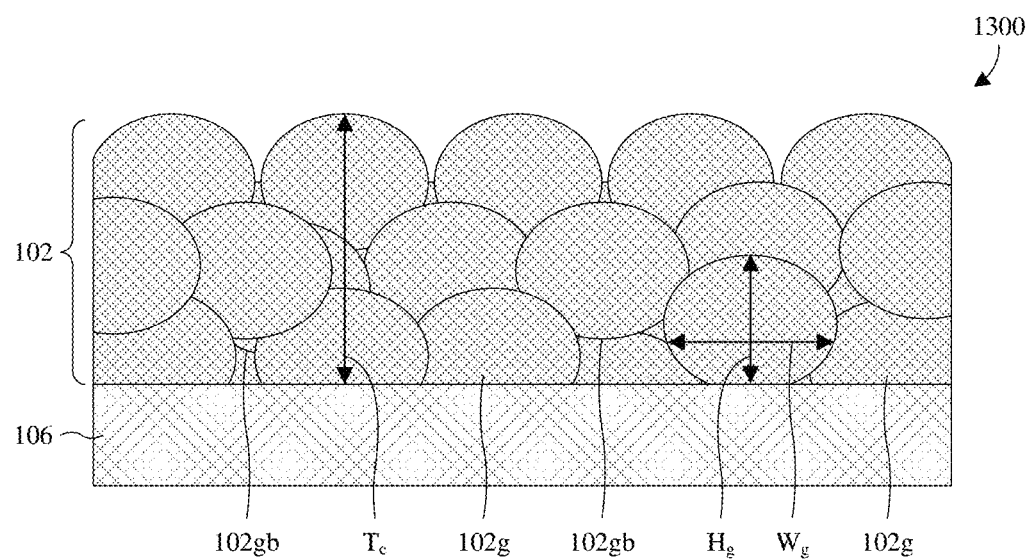
FIGS. 13-15 illustrate a series of cross-sectional views of some embodiments of a method for roughening a crystalline layer.
Figure 14:
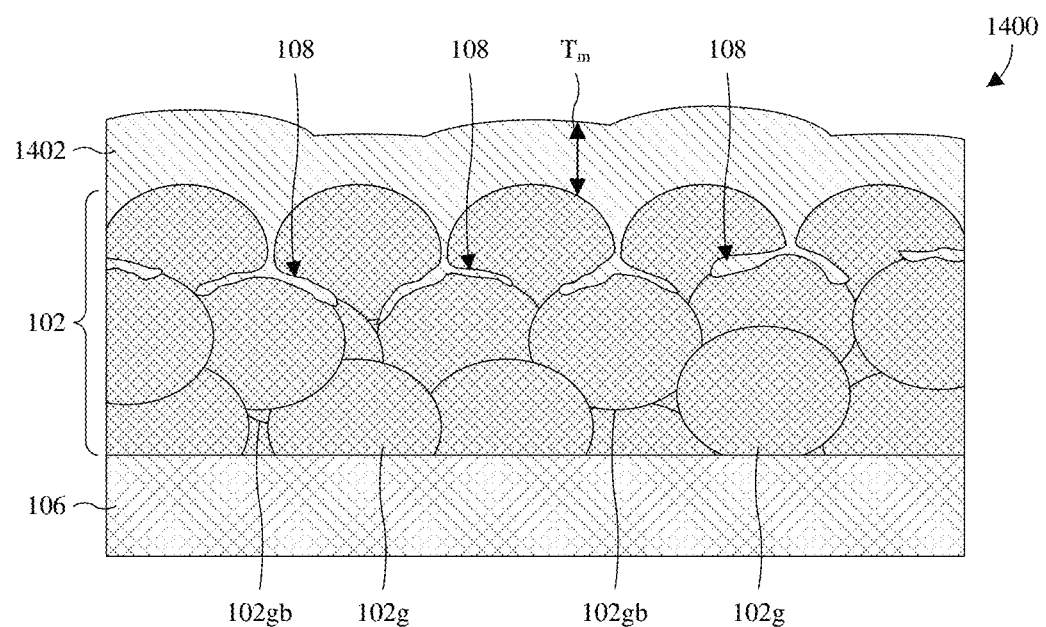
Figure 15:
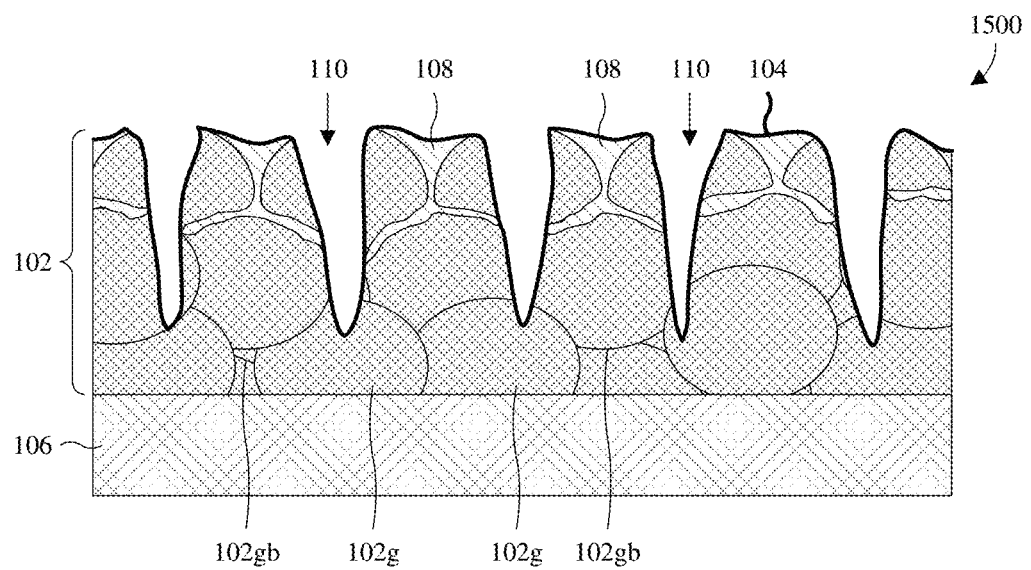

With reference to FIGS. 13-15, a series of cross-sectional views 1300-1500 of some embodiments of a method for roughening a crystalline layer 102 is provided. The method illustrates formation of the crystalline layer 102 according to the embodiments of FIG. 1 but may be employed to form the crystalline layer 102 according to the embodiments of FIG. 2A, according to the embodiments of FIG. 2B, or according to some other suitable embodiments.

As illustrated by the cross-sectional view 1300 of FIG. 13, a crystalline layer 102 is deposited over a substrate 106. The crystalline layer 102 has a plurality of grains 102g. While the grains 102g are illustrated according to the embodiments in FIG. 1, the grains 102g may alternatively be according to the embodiments of FIG. 2A, FIG. 2B, or some other suitable embodiments. The grains 102g have individual widths $W_g$, individual heights $H_g$, and individual depths (not shown). Note that the individual depths extend into and out of the page and are hence not visible within the cross-sectional view 1300 of FIG. 13. The individual widths $W_g$, the individual heights $H_g$, the individual depths, or any combination of the foregoing may, for example, be about 5-100 nanometers, about 5-50 nanometers, about 50-100 nanometers, about 50-200 nanometers, or some other suitable value. The crystalline layer 102 may, for example, be or comprise polysilicon and/or some other suitable crystalline material.

In some embodiments, the crystalline layer 102 is deposited with a thickness $T_c$ that is about 500-50000 angstroms, about 500-5000 angstroms, about 5000-25000 angstroms, about 25000-50000 angstroms, or some other suitable value. If the thickness $T_c$ is too small (e.g., less than about 500 angstroms or some other suitable value), a subsequently performed etch may extend into and damage the substrate 106. If the thickness $T_c$ is too large (e.g., greater than about 50000 angstroms or some other suitable value), deposition of the crystalline layer 102 may be excessive and throughput during bulk manufacture may be substantially reduced.

The crystalline layer 102 may, for example, be deposited by low-pressure chemical-vapor deposition (LPCVD) or some other suitable deposition process. LPCVD may, for example, be performed at about 500-550 degrees Celsius and/or some other suitable temperature(s). In some embodiments, the temperature(s) at which the crystalline layer 102 is deposited vary sizes of the grains 102g. For example, high temperatures may lead to smaller grains whereas lower temperatures may lead to larger grains.

As illustrated by the cross-sectional view 1400 of FIG. 14, a mask material 1402 is diffused into the crystalline layer 102 along the grain boundaries 102gb. The mask material 1402 defines micro masks 108 embedded in the crystalline layer 102 along the grain boundaries 102gb. As seen hereafter, the micro masks 108 are used hereafter for roughening the crystalline layer 102. The mask material 1402 may, for example, be or comprise silicon oxide, silicon nitride, some other suitable material(s), or any combination of the foregoing.

In some embodiments, the mask material 1402 is has a thickness $T_m$ that is about 10-1000 nanometers, about 10-500 nanometers, about 500-1000 nanometers, or some other suitable value after the diffusing. If the thickness $T_m$ is too small (e.g., less than about 10 nanometers or some other suitable value), a uniformity of the mask material 1402 may be poor and the etch hereafter performed for roughening my yield non-uniform roughening. For example, different portions of the crystalline layer 102 may have different degrees of roughening. If the thickness $T_m$ is too large (e.g., greater than about 1000 nanometers or some other suitable value), the etch hereafter performed for roughening may take an excessive amount of time to complete and throughput during bulk manufacture may be substantially reduced.

In at least some embodiments in which the mask material 1402 is or comprises oxide, the mask material 1402 is deposited by thermal oxidation. In alternative embodiments, the mask material 1402 is deposited by some other suitable process. Thermal oxidation may, for example, be performed by exposing the crystalline layer 102 to oxygen (e.g., $O_2$) gas at elevated temperatures of about 800-1200 degrees Celsius, about 800-1000 degrees Celsius, or 1000-1200 degrees Celsius. Other suitable gases comprising oxygen and/or other suitable temperatures are, however, amenable.

The elevated temperatures may, for example, enable oxygen to penetrate into the crystalline layer 102 and to form the mask material 1402 along the grain boundaries 102gb. If the thermal oxidation is performed at temperatures that are too low (e.g., less than about 800 degrees Celsius or some other suitable temperature) or too high (e.g., greater than about 1200 degrees Celsius or some other suitable temperature), oxygen may fail to penetrate into the crystalline layer 102 and hence the mask material 1402 may fail to form buried in the crystalline layer 102 along the grain boundaries 102gb.

As illustrated by the cross-sectional view 1500 of FIG. 15, an etch is performed into the mask material 1402 and the crystalline layer 102 to form trenches 110 and a rough surface 104. By increasing the etch time, the depth of the trenches 110 may be increased and hence roughness of the rough surface 104 may be increased. Similarly, by decreasing the etch time, the depth of the trenches 110 may be decreased and hence the roughness may be decreased.

The etch employs an etchant having a high selectivity for crystalline layer 102 relative to the mask material 1402, such that the etch rate for the crystalline layer 102 is high relative to the etch rate for the mask material 1402. Because of the high etch rate, the etch slowly etches back a bulk of the mask material 1402 until the crystalline layer 102 is exposed. At this point, the micro masks 108 persist because the micro masks 108 formed buried in the crystalline layer 102 along the grain boundaries 102gb. As the etch proceeds, the etch slowly etches into the micro masks 108 while quickly etching into the crystalline layer 102 where unprotected by the micro masks 108. As a result, the trenches 110 form where unprotected by the micro masks 108 and at least some of the micro masks 108 persist to completion of the etch.

The grains 102g have a high degree of variability, such that the grain boundaries 102gb have a high degree of variability. This leads to high degree of variability in the micro masks 108. Because the etch exposes portions of the micro masks 108, and because the micro masks 108 have a high degree of variability, the rough surface 104 takes on this high degree of variability at the micro masks 108. Further, because the micro masks 108 have a high degree of variability and serve as a mask while forming the trenches 110, the trenches 110 have a high degree of variability and the rough surface 104 takes on this high degree of variability at the trenches 110. The high degrees of variability at the trenches 110 and at the micro masks 108, in turn, lead to a high degree of roughness along the rough surface 104.

The high etch rate for the crystalline layer 102 may, for example, be about 5-20 times, about 5-10 times, or about 10-20 time greater than that for the mask material 1402. Other suitable multiples are, however, amenable. If the multiple is too low (e.g., less than about 5 or some other suitable value), the micro masks 108 may provide little protection to underlying portions of the crystalline layer 102 and the roughening may be minimal. If the multiple is too high (e.g., greater than about 20 or some other suitable value), the etch may take a long time to etch back the bulk of the mask material 1402. As such, the etch may take a long time to complete and throughput during bulk manufacture may be substantially reduced.

The etch may, for example, be performed by dry plasma etching or some other suitable type of etching. In some embodiments, the etch is anisotropic. In some embodiments in which the etch is performed by dry plasma etching, the etch employs an etch gas being or comprising chlorine gas (e.g., $Cl_2$), a flow rate of about 10-100 standard cubic centimeters per minute (SCCM), a pressure of about 10-100 millitorr, or any combination of the foregoing. Other etch gases, flow rates, and pressures are, however, amenable. Dry plasma etching using chlorine gas as above may be used in some, but not all, embodiments in which the crystalline layer 102 is polysilicon and the micro masks 108 are silicon oxide.

While FIGS. 13-15 are described with reference to various embodiments of a method, it will be appreciated that the structures shown in FIGS. 13-15 are not limited to the method but rather may stand alone separate of the method. While FIGS. 13-15 are described as a series of acts, it will be appreciated that the order of the acts may be altered in other embodiments. While FIGS. 13-15 illustrate and describe as a specific set of acts, some acts that are illustrated and/or described may be omitted in other embodiments. Further, acts that are not illustrated and/or described may be included in other embodiments.

For example, in alternative embodiments, the micro masks 108 may be removed after the etch as illustrated at FIG. 2B. The removal may, for example, be performed by an etching process or some other suitable removal process.

Figure 16:
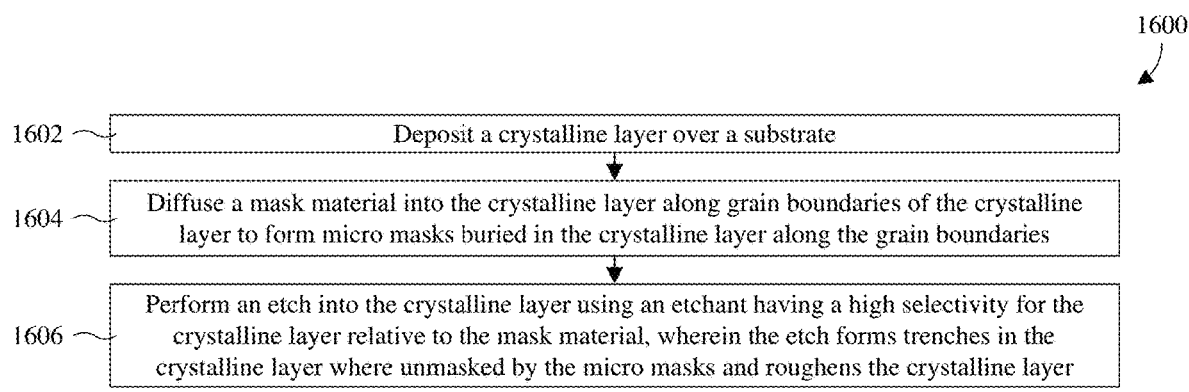
FIG. 16 illustrates a block diagram of some embodiments of the method of FIGS. 13-15.

With reference to FIG. 16, a block diagram 1600 of some embodiments of the method of FIGS. 13-15 is provided.

At 1602, a crystalline layer is deposited over a substrate. See, for example, FIG. 13.

At 1604, a mask material is diffused into the crystalline layer along grain boundaries of the crystalline layer to form micro masks buried in the crystalline layer along the grain boundaries. See, for example, FIG. 14.

At 1606, an etch is performed into the oxide layer and the crystalline layer using an etchant having a high selectivity for the crystalline layer relative to the mask material, wherein the etch forms trenches in the crystalline layer where unmasked by the micro masks and roughens the crystalline layer. See, for example, FIG. 15.

While the block diagram 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 17, 18A, 18B, 19, 20A, 20B, and 21-24, a series of cross-sectional views 1700, 1800A, 1800B, 1900, 2000A, 2000B, and 2100-2400 of some embodiments of a method for forming a MEMS package comprising a MEMS motion sensor and a rough crystalline layer is provided. The method illustrates formation of the MEMS package according to the embodiments of FIG. 3 but may, for example, be employed to form the MEMS package according to other suitable embodiments.

Figure 17:
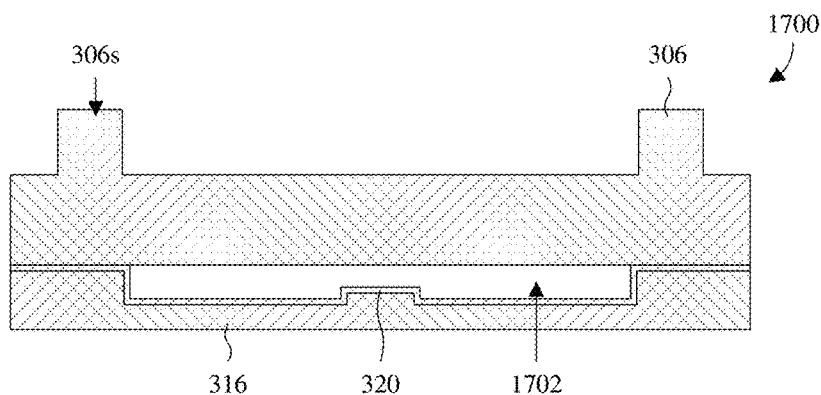
FIGS. 17, 18A, 18B, 19, 20A, 20B, and 21-24 illustrate a series of cross-sectional views of some embodiments of a method for forming a MEMS package comprising a MEMS motion sensor and a rough crystalline layer.

As illustrated by the cross-sectional view 1700 of FIG. 17, a cap substrate 316 is patterned to form a recess 1702 on an upper side of the cap substrate 316. Further, an inter-substrate dielectric layer 320 is deposited covering the upper side of the cap substrate 316 and lining the recess 1702. The patterning may, for example, be performed by and/or using a photolithography/etching process and/or some other suitable process.

Also illustrated by the cross-sectional view 1700 of FIG. 17, an under side of a MEMS substrate 306 is bonded to the cap substrate 316 through the inter-substrate dielectric layer 320. In some embodiments, the bonding hermetically seals the recess 1702. The bonding may, for example, be performed by fusion bonding and/or some other suitable bonding process.

Also illustrated by the cross-sectional view 1700 of FIG. 17, the MEMS substrate 306 is patterned to form a standoff 306s protruding upward on an upper side of the MEMS substrate 306. The standoff 306s may, for example, have a square ring-shaped layout as in FIG. 4 or some other suitable layout. The patterning may, for example, be performed by and/or using a photolithography/etching process and/or some other suitable process.

Figure 18A:
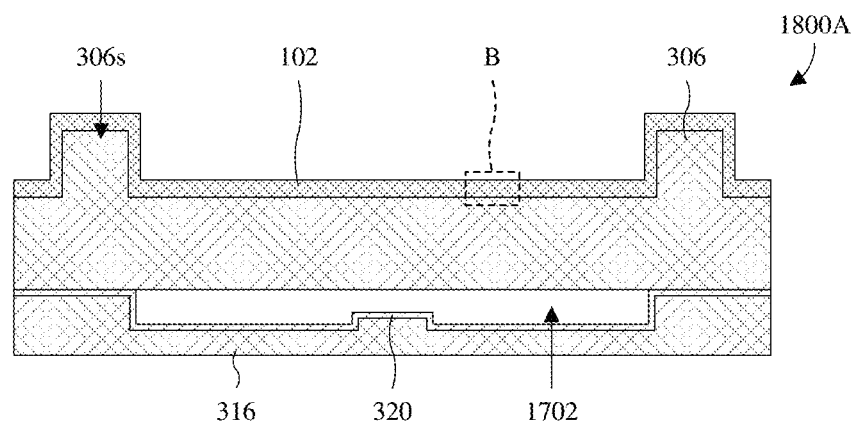
Figure 18B:
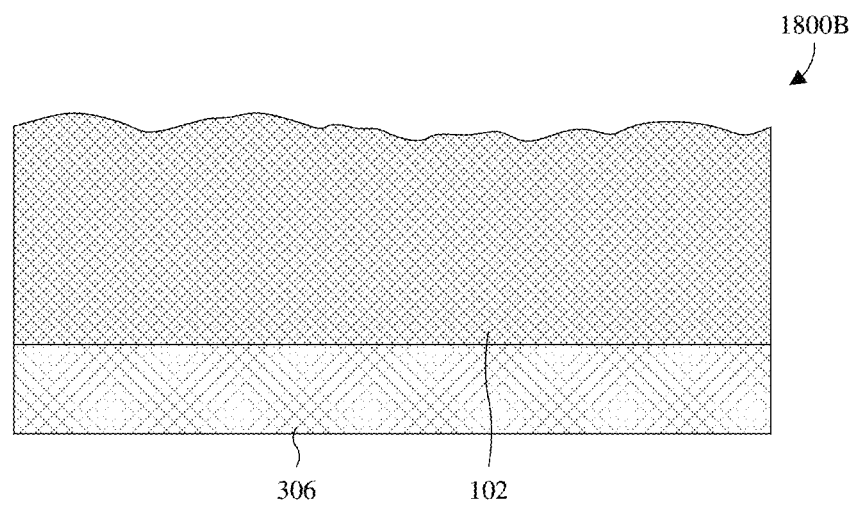

As illustrated by the cross-sectional views 1800A, 1800B of FIGS. 18A and 18B, a crystalline layer 102 is deposited covering the upper side of the MEMS substrate 306 as described with regard to FIG. 13. FIG. 18B provides an enlarged cross-sectional view 1800B of some embodiments of the crystalline layer 102 within box B of FIG. 18A. Note that FIG. 18A, FIG. 18B, and subsequent figures do not show crystalline grains and grain boundaries for ease of illustration. FIGS. 1, 2A, 2B, 13-15 provide non-limiting examples.

Figure 19:
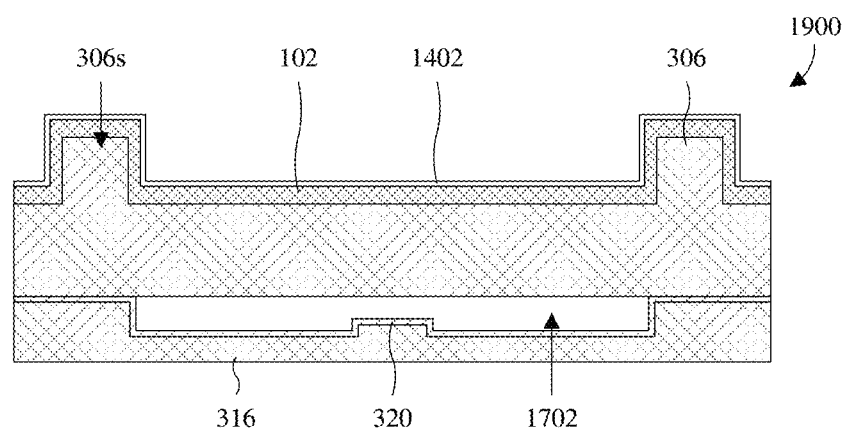

As illustrated by the cross-sectional view 1900 of FIG. 19, a mask material 1402 is diffused into the crystalline layer 102 along grain boundaries (not shown; see, for example, FIG. 14) of the crystalline layer 102 as described with regard to FIG. 14. The mask material 1402 that diffused into the crystalline layer 102 defines micro masks (not shown; see, for example, FIG. 14). Note that FIG. 19 and subsequent figures do not show micro masks for ease of illustration. FIGS. 1, 2A, 14, and 15 provide non-limiting examples.

Figure 20A:
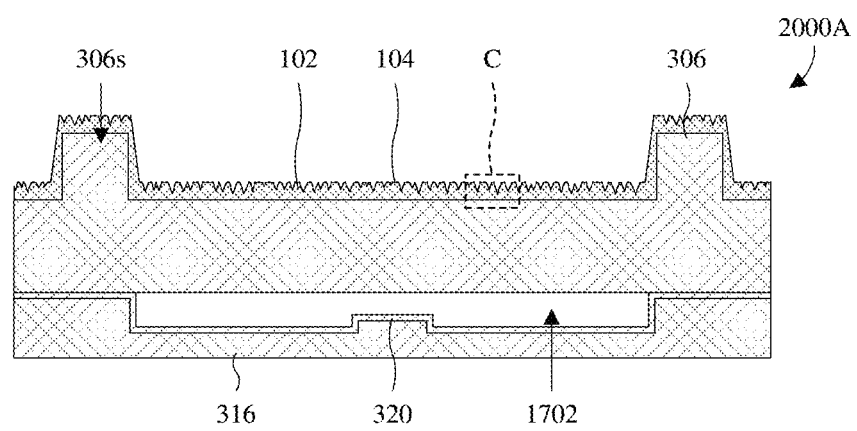
Figure 20B:
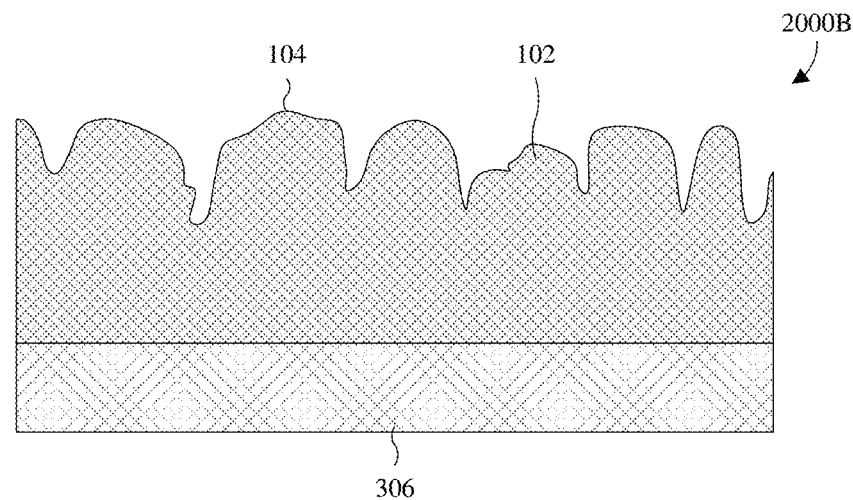

As illustrated by the cross-sectional views 2000A, 2000B of FIGS. 20A and 20B, an etch is performed into the crystalline layer 102 to form trenches 110 and a rough surface 104 as described with regard to FIG. 15. FIG. 20B provides an enlarged cross-sectional view 2000B of some embodiments of the crystalline layer 102 within box C of FIG. 20A. As noted above, FIGS. 20A and 20B, do not show grains, grain boundaries, and micro masks for ease of illustration, but FIGS. 1, 2A, and 2B provide non-limiting examples. In alternative embodiments, any one of FIGS. 1, 2A, and 2B is taken within box C.

Figure 21:
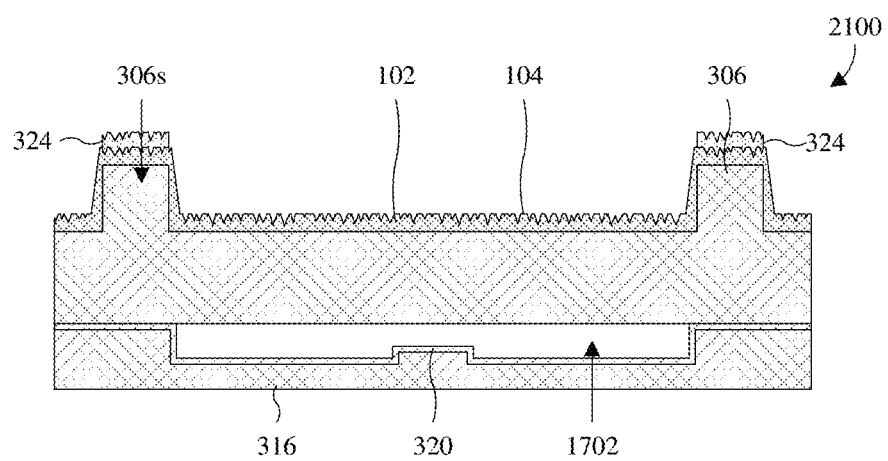

As illustrated by the cross-sectional view 2100 of FIG. 21, a MEMS-side eutectic bond structure 324 is formed overlying the standoff 306s on the crystalline layer 102. The MEMS-side eutectic bond structure 324 may, for example, have a square ring-shaped layout as in FIG. 4 or some other suitable layout. A process for forming the MEMS-side eutectic bond structure 324 may comprise depositing a eutectic bond layer and patterning the eutectic bond layer into the MEMS-side eutectic bond structure 324 by a photolithography/etching process. Other suitable processes are, however, amenable.

Figure 22:
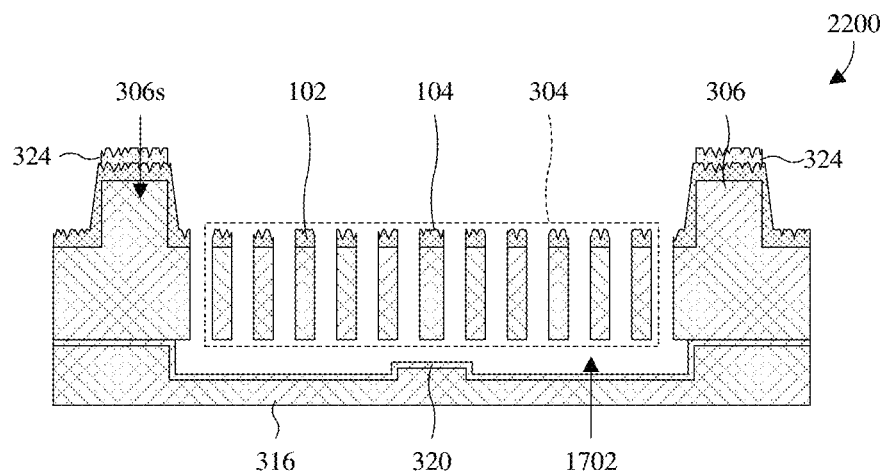

As illustrated by the cross-sectional view 2200 of FIG. 22, the MEMS substrate 306 is patterned to open the recess 1702 in the cap substrate 316 and to form a moveable structure 304 overlying the recess 1702. The moveable structure 304 may, for example, be formed by a photolithography/etching process or some other suitable process.

Figure 23:
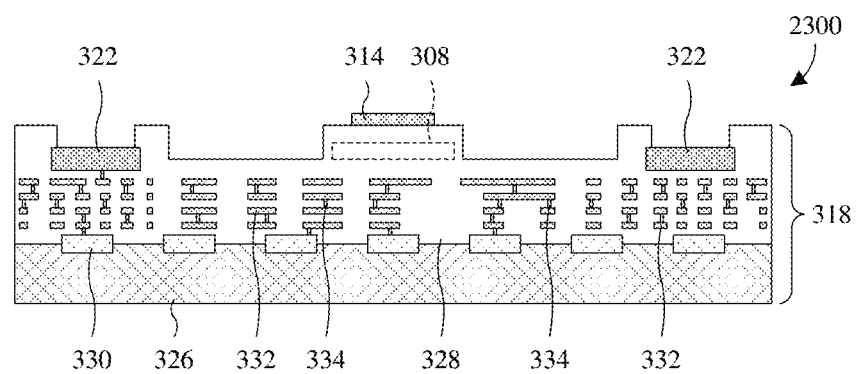

As illustrated by the cross-sectional view 2300 of FIG. 23, an IC 318 is formed or otherwise provided. The IC 318 comprises a device substrate 326, an interconnect dielectric layer 328, and a plurality of semiconductor devices 330. The interconnect dielectric layer 328 overlies the device substrate 326, and the semiconductor devices 330 are in the device substrate 326 between the interconnect dielectric layer 328 and the device substrate 326. The interconnect dielectric layer 328 accommodates a plurality of wires 332 and a plurality of vias 334. The wires 332 and the vias 334 are alternatingly stacked to define conductive paths leading from the semiconductor devices 330 and may, for example, define an electrical interconnect structure.

An IC-side eutectic bond structure 322, a sensing electrode 308, and bump structure 314 are on an opposite side of the interconnect dielectric layer 328 as the device substrate 326. Note that the sensing electrode 308 is schematically shown in phantom and may, for example, have a different form and/or location. The IC-side eutectic bond structure 322 facilitates eutectic bonding to the MEMS substrate 306 (see, e.g., FIG. 22), and the sensing electrode facilitates sensing of movement by the moveable structure 304 (see, e.g., FIG. 22). The IC-side eutectic bond structure 322 may, for example, have a square ring-shaped layout as in FIG. 4 or some other suitable layout. The bump structure 314 may, for example, absorb gases within a cavity hereafter formed and/or may, for example, provide some other suitable function. In some embodiments, the wires 332 and the vias 334 define a conductive path leading to the sensing electrode 308 and/or define a conductive path leading to the IC-side eutectic bond structure 322.

Figure 24:
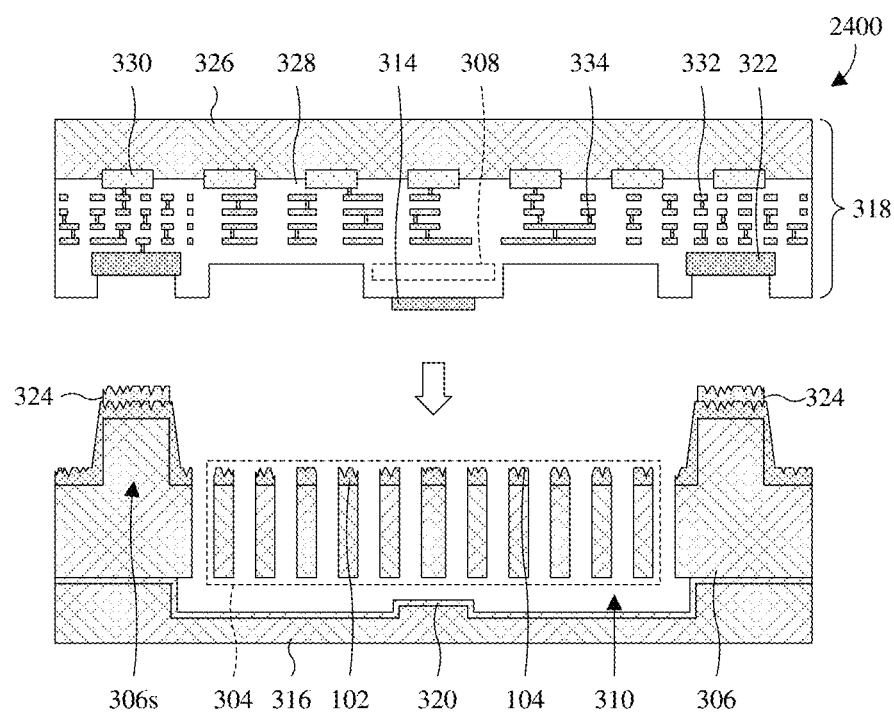

As illustrated by the cross-sectional view 2400 of FIG. 24, the IC 318 is flipped vertically and eutectically bonded to the MEMS substrate 306 at an interface between the IC-side eutectic bond structure 322 and the MEMS-side eutectic bond structure 324. In alternative embodiments, some other suitable bonding process is performed. The eutectic bonding defines a cavity 310 between the IC 318 and the cap substrate 316 and, in some embodiments, the cavity 310 is hermetically sealed. The moveable structure 304 is moveable within the cavity 310 in response to gravity, acceleration, or some other suitable stimuli.

Because a top surface of the moveable structure 304 is roughened, the likelihood of stiction between the top surface of the moveable structure 304 and a top surface of the cavity 310 is reduced. The roughness reduces the contact area between the top surface of the moveable structure 304 and the top surface of the cavity 310 if the top surfaces come into contact. As such, van der Waals force and other suitable forces that lead to stiction are reduced and hence the likelihood of stiction is reduced. The reduced likelihood of stiction may, in turn, increase the sensitivity and/or lifetime of the MEMS package.

While FIGS. 17, 18A, 18B, 19, 20A, 20B, and 21-24 are described with reference to various embodiments of a method, it will be appreciated that the structures shown in FIGS. 17, 18A, 18B, 19, 20A, 20B, and 21-24 are not limited to the method but rather may stand alone separate of the method. While FIGS. 17, 18A, 18B, 19, 20A, 20B, and 21-24 are described as a series of acts, it will be appreciated that the order of the acts may be altered in other embodiments. While FIGS. 17, 18A, 18B, 19, 20A, 20B, and 21-24 illustrate and describe as a specific set of acts, some acts that are illustrated and/or described may be omitted in other embodiments. Further, acts that are not illustrated and/or described may be included in other embodiments.

Figure 25:
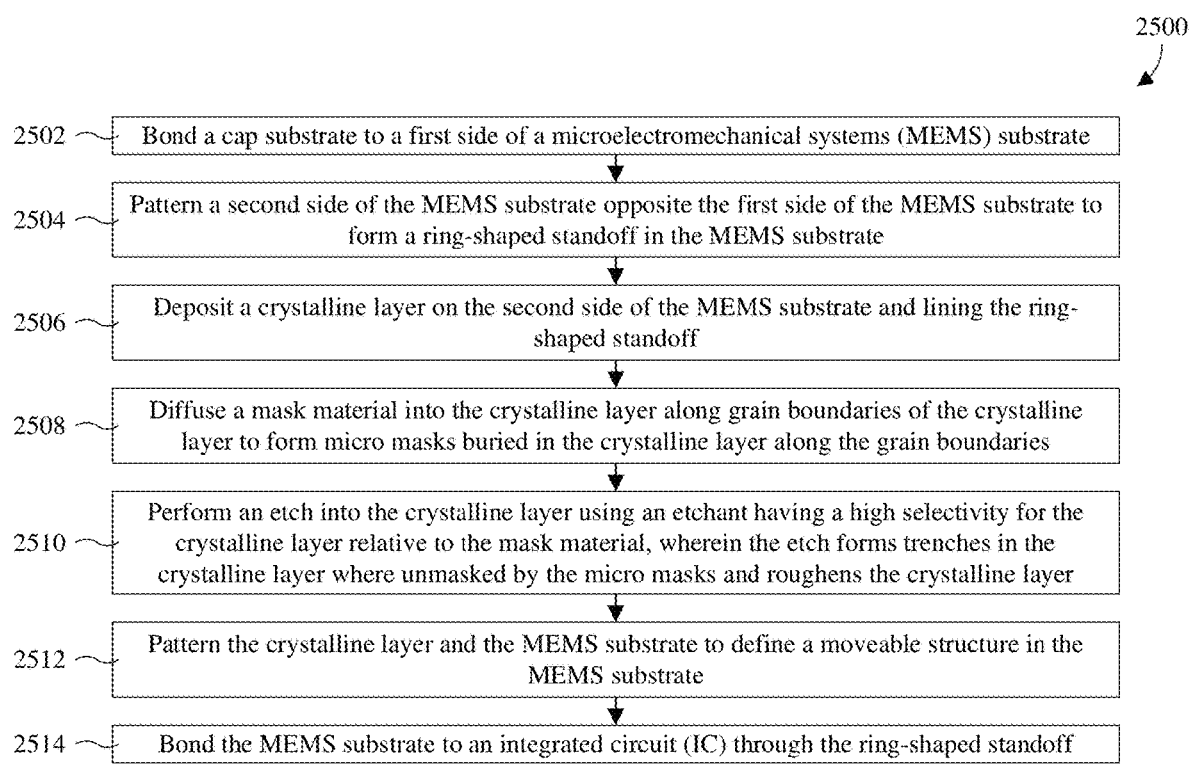
FIG. 25 illustrates a block diagram of some embodiments of the method of FIGS. 17, 18A, 18B, 19, 20A, 20B, and 21-24.

With reference to FIG. 25, a block diagram 2500 of some embodiments of the method of FIGS. 17, 18A, 18B, 19, 20A, 20B, and 21-24 is provided.

At 2502, a cap substrate is bonded to a first side of a MEMS substrate. See, for example, FIG. 17.

At 2504, a second side of the MEMS substrate opposite the first side of the MEMS substrate is patterned to form a ring-shaped standoff in the MEMS substrate. See, for example, FIG. 17.

At 2506, a crystalline layer is deposited on the second side of the MEMS substrate and lining the ring-shaped standoff. See, for example, FIG. 13 and FIGS. 18A and 18B.

At 2508, a mask material is diffused into the crystalline layer along grain boundaries of the crystalline layer to form micro masks buried in the crystalline layer along the grain boundaries. See, for example, FIGS. 14 and 19.

At 2510, an etch is performed into the crystalline layer using an etchant having a high selectivity for the crystalline layer relative to the mask material, wherein the etch forms trenches in the crystalline layer where unmasked by the micro masks and roughens the crystalline layer. See, for example, FIG. 15 and FIGS. 20A and 20B.

At 2512, the crystalline layer and the MEMS substrate are patterned to define a moveable structure in the MEMS substrate. See, for example, FIG. 22.

At 2514, the MEMS substrate is bonded to an IC through the ring-shaped standoff. See, for example, FIGS. 21, 23, and 24.

While the block diagram 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a semiconductor structure including: a first substrate; a crystalline layer on the first substrate; and a plurality of micro masks diffused into the crystalline layer along grain boundaries of the crystalline layer from a surface of the crystalline layer, wherein the surface has a plurality of trenches separating the micro masks from one another. In some embodiments, the crystalline layer includes polysilicon, wherein the micro masks include oxide. In some embodiments, the plurality of trenches includes a first trench and a second trench, wherein the first and second trenches have different cross-sectional profiles. In some embodiments, the plurality of micro masks includes a first micro mask and a second micro mask, wherein the first and second micro masks have different cross-sectional profiles. In some embodiments, the first substrate defines a MEMS structure, wherein the semiconductor structure further includes: a second substrate that is independent of and bonded to the first substrate, wherein the MEMS structure and the crystalline layer are moveable together relative to the second substrate within a cavity between the MEMS structure and the second substrate. In some embodiments, the crystalline layer overlies the MEMS structure, and wherein the semiconductor structure further includes: a second crystalline layer that underlies the MEMS structure; and a plurality of second micro masks diffused into the second crystalline layer along grain boundaries of the second crystalline layer from a surface of the second crystalline layer, wherein the surface of the second crystalline layer has a plurality of second trenches separating the micro masks from each other. In some embodiments, the semiconductor structure further includes a second substrate that is independent of and bonded to the first substrate, wherein second substrate defines a MEMS structure that is moveable relative to the first substrate and the crystalline layer within a cavity between the MEMS structure and the first substrate.

In some embodiments, the present disclosure provides a MEMS package including: an IC; a substrate bonded to and independent of the IC, wherein the substrate defines a MEMS structure that is moveable relative to the IC within a cavity between the IC and the substrate; a crystalline layer in the cavity and having a rough surface configured to reduce stiction between the MEMS structure and the IC; and a plurality of micro features embedded in the crystalline layer along grain boundaries of the crystalline layer, wherein the crystalline layer defines trenches at the rough surface that space the micro features, and wherein the micro features are masks or cavities. In some embodiments, the micro features are or include an oxide of the crystalline layer. In some embodiments, the micro features are or include a dielectric material, and sidewalls of the trenches are formed with both the micro features and the crystalline layer. In some embodiments, the micro features are cavities in direct fluid communication with an atmosphere of the cavity. In some embodiments, the plurality of micro features includes a first micro feature and a second micro feature, wherein the rough surface has different cross-sectional profiles respectively at the first and second micro features. In some embodiments, the micro features extend into the crystalline layer to a first depth from the rough surface, wherein the trenches extend into the crystalline layer to a second depth from the rough surface, and wherein the second depth is greater than the first depth.

In some embodiments, the present disclosure provides a method including: depositing a crystalline layer over a first substrate; diffusing a mask material into the crystalline layer along grain boundaries of the crystalline layer; and performing a first etch into the crystalline layer with an etchant having a high selectivity for the crystalline layer relative to the mask material, wherein the mask material that diffused into the crystalline layer defines micro masks that protect underlying portions of the crystalline layer during the first etch, and wherein the first etch forms trenches in the crystalline layer where unmasked by the micro masks. In some embodiments, the etchant respectively has a first etch rate and a second etch rate respectively for the crystalline layer and the mask material, wherein the first etch rate is about 5-20 times greater than the second etch rate. In some embodiments, the crystalline layer is polysilicon, wherein the mask material is formed by thermal oxidation of the polysilicon. In some embodiments, the first etch is performed by plasma etching using an etch gas including chlorine. In some embodiments, the method further includes: forming a microelectromechanical systems (MEMS) structure in the first substrate and the crystalline layer after the first etch; providing a second substrate on which an interconnect structure and semiconductor devices are arranged; and bonding the first substrate to the second substrate, such that the crystalline layer and the interconnect structure are between the first and second substrates. In some embodiments, the method further includes patterning the first substrate to define a ring-shaped standoff in the first substrate, wherein the crystalline layer is deposited on and lining the ring-shaped standoff. In some embodiments, the forming of the MEMS structure includes performing a second etch selectively into the crystalline layer and the first substrate after the first etch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package comprising:
an integrated circuit (IC);
a substrate bonded to and independent of the IC, wherein the substrate defines a MEMS structure that is moveable relative to the IC within a cavity between the IC and the substrate;
a crystalline layer in the cavity and having a rough surface configured to reduce stiction between the MEMS structure and the IC; and
a plurality of micro features embedded in the crystalline layer along grain boundaries of the crystalline layer, wherein the crystalline layer defines trenches at the rough surface that space the micro features, and wherein the micro features are masks or cavities.

2. The MEMS package according to claim 1, wherein the micro features are or comprise an oxide of the crystalline layer.

3. The MEMS package according to claim 1, wherein the micro features are or comprise a dielectric material, and sidewalls of the trenches are formed with both the micro features and the crystalline layer.

4. The MEMS package according to claim 1, wherein the micro features are cavities in direct fluid communication with an atmosphere of the cavity.

5. The MEMS package according to claim 1, wherein the plurality of micro features comprises a first micro feature and a second micro feature, and wherein the rough surface has different cross-sectional profiles respectively at the first and second micro features.

6. The MEMS package according to claim 1, wherein the micro features extend into the crystalline layer to a first depth from the rough surface, wherein the trenches extend into the crystalline layer to a second depth from the rough surface, and wherein the second depth is greater than the first depth.

7. A microelectromechanical systems (MEMS) package comprising:
an integrated circuit (IC);
a substrate bonded to and independent of the IC, wherein the substrate defines a MEMS structure that is moveable relative to the IC within a cavity between the IC and the substrate;
a crystalline layer in the cavity and having a rough surface configured to reduce stiction between the MEMS structure and the substrate; and
a plurality of micro masks diffused into the crystalline layer along grain boundaries of the crystalline layer from the rough surface of the crystalline layer, wherein the rough surface has a plurality of trenches separating the micro masks from one another.

8. The MEMS package according to claim 7, wherein the substrate has a pair of protrusions protruding towards the IC, and respectively on opposite sides of the cavity, when viewed in profile, and wherein the crystalline layer is on sidewalls of the protrusions and separates the protrusions from the IC.

9. The MEMS package according to claim 7, further comprising:
a pair of eutectic bond structures between and directly contacting the crystalline layer and the IC die, and wherein an interface at which the eutectic bond structures directly contact the crystalline layer has a series of peaks and valleys.

10. The MEMS package according to claim 7, wherein the plurality of trenches comprises a first trench, wherein the first trench has a height and a width, and wherein a ratio of the width to the height is about 1.2-0.14.

11. The MEMS package according to claim 7, wherein the rough surface has an arithmetic average roughness Ra greater than about 5 nanometers.

12. The MEMS package of claim 7, wherein the crystalline layer is on a top side of the MEMS structure and is movable.

13. The MEMS package according to claim 7, wherein the crystalline layer comprises silicon and the micro masks comprise a dielectric.

14. A microelectromechanical systems (MEMS) package comprising:
a first substrate;
a crystalline layer on the first substrate; and
a plurality of dielectric masks extending into the crystalline layer along grain boundaries of the crystalline layer from a top surface of the crystalline layer, wherein the dielectric masks are localized to the grain boundaries and are on multiple sides of corresponding crystalline grains at the top surface;
wherein the crystalline layer has a plurality of trenches uncovered by the dielectric masks.

15. The MEMS package according to claim 14, wherein the plurality of dielectric masks comprises a first dielectric mask at a top grain boundary of a first crystalline grain in the crystalline layer and a bottom grain boundary of the first crystalline grain.

16. The MEMS package of claim 14, wherein the crystalline layer comprises polysilicon, and wherein the dielectric masks comprise oxide.

17. The MEMS package of claim 14, wherein the top surface has an arithmetic average roughness between 5 and 50 nanometers.

18. The MEMS package of claim 14, wherein the first substrate defines a MEMS structure comprising a moveable mass, and wherein the crystalline layer is on and moveable with the moveable mass.

19. The MEMS package of claim 14, wherein the plurality of dielectric masks comprises a first dielectric mask, wherein the first dielectric mask and the crystalline layer form a common sidewall in a first trench of the plurality of trenches, and wherein the first dielectric mask forms multiple discrete segments of the common sidewall that are spaced from each other.

20. The MEMS package of claim 14, further comprising:
a second substrate overlying and bonded to the first substrate through the crystalline layer, wherein the first substrate forms a MEMS structure configured to move within a cavity between the first and second substrates.

* * * * *